United States Patent
Hata et al.

(10) Patent No.: US 7,872,418 B2
(45) Date of Patent: Jan. 18, 2011

(54) LIGHT EMITTING DEVICE AND METHOD FOR MANUFACTURING THE SAME

(75) Inventors: Toshio Hata, Mihara (JP); Masahiro Konishi, Ikoma (JP); Makoto Agatani, Mihara (JP); Taiji Morimoto, Onomichi (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 338 days.

(21) Appl. No.: 12/051,602

(22) Filed: Mar. 19, 2008

(65) Prior Publication Data

US 2008/0231169 A1      Sep. 25, 2008

(30) Foreign Application Priority Data

Mar. 23, 2007  (JP)  ............................. 2007-077313

(51) Int. Cl.
 *H01L 33/00*  (2010.01)
(52) U.S. Cl. ............................. 313/512; 313/46; 445/25
(58) Field of Classification Search ................. 313/512, 313/46; 257/100; 445/25
 See application file for complete search history.

(56) References Cited

U.S. PATENT DOCUMENTS 3,875,456 A * 4/1975 Kano et al. .................. 313/501
5,786,665 A * 7/1998 Ohtsuki et al. .............. 313/512
2004/0100192 A1 * 5/2004 Yano et al. ................... 313/512
2004/0135504 A1 7/2004 Tamaki et al.
2004/0188700 A1 9/2004 Fukasawa et al.
2005/0225222 A1 * 10/2005 Mazzochette et al. ......... 313/46

FOREIGN PATENT DOCUMENTS

JP    2001-007405 A    1/2001
JP    2004-071726 A    3/2004

\* cited by examiner

*Primary Examiner*—Peter J Macchiarolo
*Assistant Examiner*—Mary Ellen Bowman
(74) *Attorney, Agent, or Firm*—Morrison & Foerster LLP

(57) ABSTRACT

By using a light emitting device including a substrate and a light emitting unit, the light emitting unit including: a plurality of light emitting elements that are mounted on substrate and electrically connected to external electrodes; a first sealing member layer containing a first fluorescent material, formed to cover light emitting elements; and a second sealing member layer containing a second fluorescent material, formed on first sealing member layer, as well as a method for manufacturing thereof, it becomes possible to provide a light emitting device capable of suppressing color shifts and the like by the fluorescent materials, and of being easily manufactured, as well as a method for manufacturing the same.

21 Claims, 18 Drawing Sheets

(a)

(b)

(c)

(d)

(a)

(b)

(c)

(a)

(b)

(c)

CHROMATICITY COORDINATES

LIGHT EMITTING DEVICE AND METHOD FOR MANUFACTURING THE SAME

This nonprovisional application is based on Japanese Patent Application No. 2007-077313 filed with the Japan Patent Office on Mar. 23, 2007, the entire contents of which are hereby incorporated by reference.

BACKGROUND OF THE INVENTION

1. Field of the Invention

The present invention relates to a light emitting device and a method for manufacturing the same.

2. Description of the Background Art

In recent years, LEDs have come to be used frequently as light sources for illumination apparatuses. Methods for obtaining white light in the illumination apparatus using LEDs include, for example, a method using three kinds of LEDs, that is, a red LED, a blue LED, and a green LED, and a method utilizing a fluorescent material that converts excited light from a blue LED to emit yellow light. With respect to the light sources for illumination apparatuses, since white light having sufficient luminance is required, illumination apparatuses using a plurality of LED chips have been commercialized.

For one example of such an illumination apparatus, Japanese Patent Laying-Open No. 2001-007405 (Patent Document 1) discloses a light emitting diode 201 as schematically shown in FIG. 28. Light emitting diode 201 in the example shown in FIG. 28 has a structure in which on a glass epoxy substrate 202 having a cathode electrode 203 and an anode electrode 204, the back face of a light emitting diode element 205 is secured, with a fluorescent material containing layer 206, formed by dispersing a fluorescent material in an adhesive agent, being interposed therebetween. Moreover, in light emitting diode 201 in the example of FIG. 28, light emitting diode element 205 is sealed by a resin sealing member 207 on its upper face side, and an auxiliary fluorescent material containing layer 208 is formed on the upper face of resin sealing member 207. Patent Document 1 describes that by providing this structure, the light emission luminance of the white light emitting diode can be improved, and that shifts in chromaticity can be suppressed.

However, in light emitting diode 201 shown in FIG. 28, since light emitting diode element 205 is secured on glass epoxy substrate 202 with fluorescent material containing layer 206 interposed therebetween, heat generated in light emitting diode element 205 is directly released to the fluorescent material in fluorescent material containing layer 206 to presumably cause the problem that the fluorescent material is altered.

Moreover, for example, Japanese Patent Laying-Open No. 2004-071726 (Patent Document 2) discloses a light emitting device 301 as schematically shown in FIG. 29. A light emitting device 301 in the example of FIG. 29 includes a package 302 having a first concave section 303 and a second concave section 304 including this first concave section 303 (first concave section 303 is formed in second concave section 304). A LED chip 305 capable of emitting light within a blue color range is mounted in first concave section 303, and first concave section 303 is filled in such a manner as to cover this LED chip 305 so that a first fluorescent layer 306 is formed. Moreover, a LED chip 307 capable of emitting light within a blue color range is mounted in second concave section 304, and second concave section 304 is filled in such a manner as to cover this LED chip 307 and first fluorescent material layer 306 so that a second fluorescent material layer 308 is formed.

Moreover, in light emitting device 301 in the example of FIG. 29, the positive electrode and the negative electrode of a lead electrode 309 are integrally formed in package 302, and the n-type electrode and p-type electrode of each of LED chips 305 and 307 are electrically connected to the positive pole and the negative pole of this lead electrode 309 by using conductive wires 310. Patent Document 2 describes that by providing this structure, it is possible to provide a light emitting device that can restrain occurrence of chromaticity shifts due to a change in ambient temperature.

Light emitting device 301 shown in FIG. 29, however, has a complicated structure in which two concave sections (first concave section 303 and second concave section 304) are formed in package 302 and two LED chips 305 and 307 are mounted, with two kinds of fluorescent material layers (first fluorescent material layer 306 and second fluorescent material layer 308) having different materials being provided therein; therefore, in manufacturing such light emitting device 301, complicated processes are required and the manufacturing cost is high.

SUMMARY OF THE INVENTION

The present invention has been made to solve the above-mentioned problems, and its object is to provide a light emitting device formed by combining light emitting elements and fluorescent materials with each other, which is capable of suppressing color shifts and the like by the fluorescent materials, and of being easily manufactured, as well as a method for manufacturing the same.

The light emitting device of the present invention includes a substrate and a light emitting unit, and is characterized in that the light emitting unit includes a plurality of light emitting elements mounted on the substrate and electrically connected to external electrodes, a first sealing member layer that is formed so as to cover the light emitting elements and contains a first fluorescent material, and a second sealing member layer that is formed on the first sealing member layer and contains a second fluorescent material (hereinafter, the light emitting device having this structure is referred to as "a light emitting device in accordance with a first aspect").

Moreover, the present invention also provides a light emitting device in accordance with the aforementioned first aspect, which is characterized by a structure in which the substrate is a metal substrate, and on the metal substrate a wiring pattern is formed on a surface and an insulating base member having a plurality of through holes that penetrate in a thickness direction is formed, and the light emitting elements are mounted inside each through hole of the insulating base member on the metal substrate, and electrically connected to the wiring pattern (hereinafter, the light emitting device having this structure is referred to as "a light emitting device in accordance with a second aspect").

Furthermore, the present invention also provides a light emitting device in accordance with the aforementioned first aspect, which is characterized by a structure in which the substrate is a metal substrate, an insulating base member is formed on the metal substrate, and metal plates are placed on the insulating base member so as to form a spaced portion therebetween, and each light emitting element is electrically connected to each metal plate while being also electrically connected to the adjacent metal plate with the spaced portion being interposed therebetween (hereinafter, the light emitting device having this structure is referred to as "a light emitting device in accordance with a third aspect").

In the aforementioned light emitting devices in accordance with the first to third aspects of the present invention, a plurality of light emitting elements are preferably mounted so as to be aligned in one row.

In the aforementioned light emitting device in accordance with the second aspect, the plurality of light emitting elements are preferably mounted in each through hole so as to be aligned in one row, and a plurality of linear wiring patterns are formed on the surface of the insulating base member in parallel with this linear alignment.

In the aforementioned light emitting device in accordance with the third aspect of the present invention, the plurality of light emitting elements are preferably mounted so as to be aligned in one row, with metal plates being placed so as to form a spaced portion in parallel with the row of light emitting elements.

In the aforementioned light emitting devices in accordance with the first to third aspects of the present invention, the light emitting elements are preferably arranged so as to form a plurality of rows in parallel with one another.

In the aforementioned light emitting device in accordance with the second aspect of the present invention, the light emitting elements arranged so as to form the plurality of rows in parallel with one another are preferably electrically connected to the wiring pattern through bonding wires commonly connected between the adjacent rows.

In the aforementioned light emitting devices in accordance with the first to third aspects of the present invention, preferably, a plurality of first sealing member layers may be formed so as to cover the light emitting elements one by one, or a single first sealing member layer may be formed so as to cover the plurality of light emitting elements, or a single first sealing member layer may be formed so as to cover all the light emitting elements. In the case where the first resin sealing member is formed so that the plurality of light emitting elements are covered with the single first sealing member layer, preferably, a plurality of first sealing member layers are formed so as to cover each row of the light emitting elements that are arranged so as to form the plurality of rows in parallel with one another.

In the aforementioned light emitting devices in accordance with the first to third aspects of the present invention, the second sealing member layer is preferably formed so as to cover at least one portion of the first sealing member layer.

In the aforementioned light emitting devices in accordance with the first to third aspects of the present invention, the second sealing member layer is preferably formed on at least any one of a plurality of first sealing member layers.

In the aforementioned light emitting devices in accordance with the first to third aspects of the present invention, the first sealing member layer is preferably formed to have a rectangular top shape, a hexagonal top shape, a round top shape, or a top shape with a plurality of straight line portions.

The aforementioned light emitting devices in accordance with the first to third aspects of the present invention are suitably used as a backlight light source of a liquid crystal display or a light source for illumination.

The present invention also provides a method for manufacturing a light emitting device including the steps of: mounting a plurality of light emitting elements on a substrate and electrically connecting the light emitting elements to external electrodes; forming a first sealing member layer containing a first fluorescent material in such a manner as to cover the light emitting elements; measuring a chromaticity characteristic of the light emitting device after the formation of the first sealing member layer; and forming a second sealing member layer on the first sealing member layer so as to adjust a chromaticity shift in accordance with the measured chromaticity characteristic.

In accordance with the present invention, it is possible to provide a light emitting device formed by combining light emitting elements and fluorescent materials with each other, which is capable of suppressing color shifts and the like by the fluorescent materials, and of being easily manufactured, as well as a method for manufacturing the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A light emitting device (a light emitting device in accordance with the first aspect) of the present invention includes a substrate and a light emitting unit, and the light emitting unit includes a plurality of light emitting elements that are mounted on the substrate and electrically connected to external electrodes, a first sealing member layer containing a first fluorescent material, which is formed in such a manner as to cover the light emitting elements, and a second sealing member layer containing a second fluorescent material, which is formed on the first sealing member layer. The light emitting device of the present invention having this basic structure makes it possible to obtain the effects that color shifts and the like can be suppressed and that it is easily manufactured. Specific structural examples of the light emitting device in accordance with the first aspect of the present invention include a light emitting device in accordance with a second aspect and a light emitting device in accordance with a third aspect, which will be described below. It should be noted that, when describing all the light emitting devices of the first aspect, the second aspect, and the third aspect, these are generally referred to as "light emitting devices of the present invention."

Figure 1:
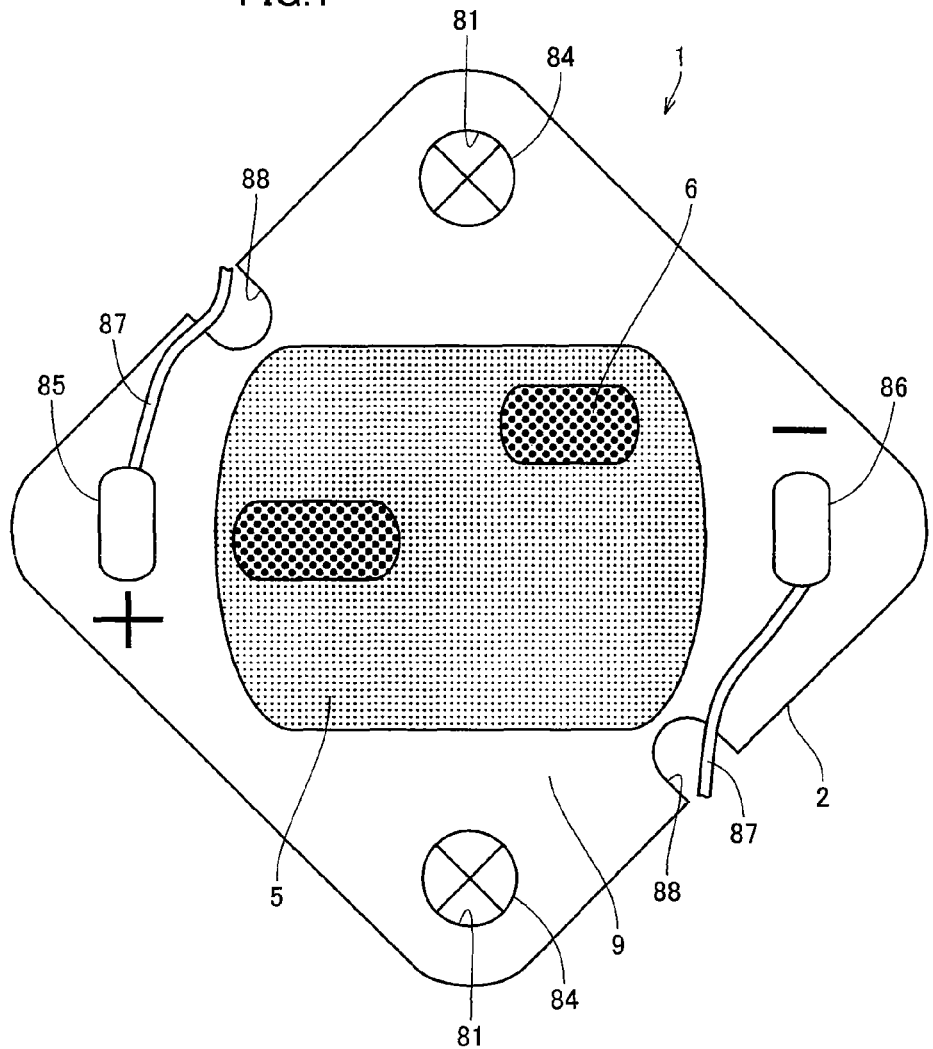
FIG. 1 is a top view schematically showing a light emitting device 1 in accordance with a first preferred example in the case where a light emitting device in accordance with the first aspect of the present invention is realized as a light emitting device in accordance with the second aspect of the present invention.
Figure 2:
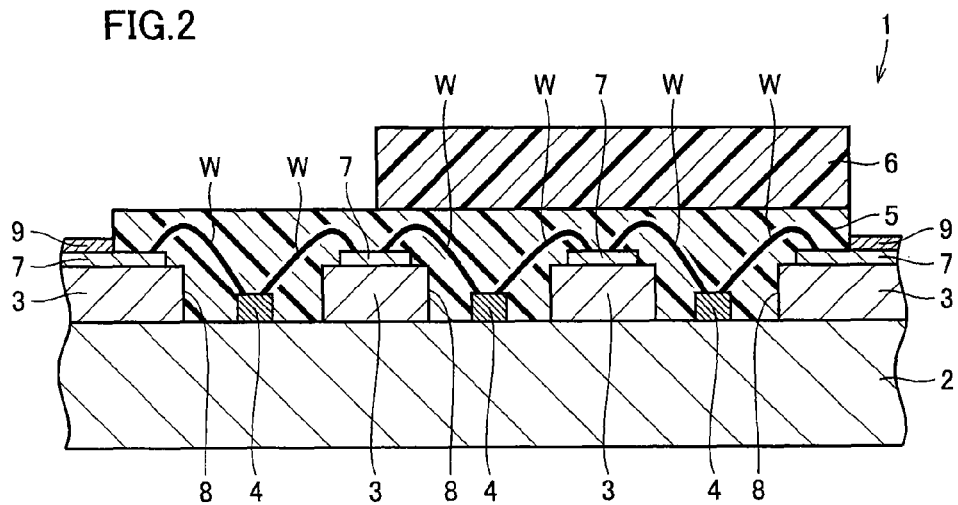
FIG. 2 is a cross-sectional view showing light emitting device 1 in the example of FIG. 1.

FIG. 1 is a top view schematically showing a light emitting device 1 in accordance with a first preferred example in the case where a light emitting device in accordance with the first aspect of the present invention is realized as a light emitting device in accordance with the second aspect of the present invention, and FIG. 2 is a cross-sectional view showing light emitting device 1 in the example of FIG. 1. The light emitting device of the second aspect of the present invention is characterized in that, in the above described basic structure of the light emitting device of the first aspect of the present invention, the substrate is a metal substrate, a wiring pattern is formed on the surface of the metal substrate, an insulating base member having a plurality of through holes that penetrate in the thickness direction is formed thereon, and light emitting elements are mounted on the metal substrate inside the through holes of the insulating base member, and electrically connected to the wiring pattern. Light emitting device 1 of the second aspect of the present invention shown in FIGS. 1 and 2 basically includes a metal substrate 2, an insulating base member 3 formed on metal substrate 2, light emitting elements 4, a first sealing member layer 5 containing a first fluorescent material, and a second sealing member layer 6 containing a second fluorescent material. In light emitting device 1 of the second aspect of the present invention, insulating base member 3 has a wiring pattern 7 formed on its surface, and also has a plurality of through holes 8 formed thereon in such a manner as to penetrate in the thickness direction. Moreover, in light emitting device 1 of the second aspect of the present invention as shown in FIGS. 1 and 2, each light emitting element 4 having two electrodes (not shown) on its upper face is mounted on metal substrate 2 exposed in each through hole 8 of insulating base member 3 and electrically connected to wiring pattern 7 by using a bonding wire W to be electrically connected to an external electrode. The plurality of light emitting elements 4 mounted in this manner are covered with and sealed by first sealing member layer 5 containing the first fluorescent material, together with bonding wire W. Moreover, second sealing member layer 6 containing the second fluorescent material is formed on first sealing member layer 5. As shown in FIG. 2, on a region of insulating base member 3 with wiring pattern 7 formed thereon, which is not covered with first sealing member layer 5, normally, a solder resist 9 is formed.

The way of arranging light emitting elements 4 in light emitting device 1 of the second aspect of the present invention is not particularly limited; however, they are preferably mounted to be arranged in one row. Moreover, in the case of light emitting device 1 of the second aspect of the present invention as shown in FIGS. 1 and 2, light emitting elements 4 are mounted in one through hole 8 so as to be arranged in one row, and linear wiring pattern 7 is formed on the surface of insulating base member 3 so as to be in parallel with this linear arrangement, so that the intervals between light emitting elements 4 can be adjusted appropriately inside each through hole 8; thus, this structure is preferable in terms of the fact that the number of light emitting devices 4 to be mounted can be adjusted in accordance with desired light emission luminance.

In light emitting device 1 of the second aspect of the present invention, the plurality of light emitting elements 4 are preferably mounted so as to be arranged to form a plurality of rows in parallel with one another. By forming the plurality of parallel rows, it is possible to achieve a planar light emitting device. In this case, more preferably, light emitting elements 4 mounted to be arranged to form the plurality of rows in parallel with one another, are electrically connected to wiring pattern 7 through a bonding wire commonly connected between the adjacent rows.

In the light emitting device of the present invention, the first sealing member layer contains the first fluorescent material, and it is only necessary that the first sealing member layer be formed so as to cover the light emitting elements. For example, FIGS. 1 and 2 show examples in which all light emitting elements 4 are covered with single first sealing member layer 5. By covering all light emitting elements 4 with single first sealing member layer 5, luminance irregularities of the light emitting device can be reduced and variation in thickness of the first sealing member layer can also be reduced.

Figure 3:
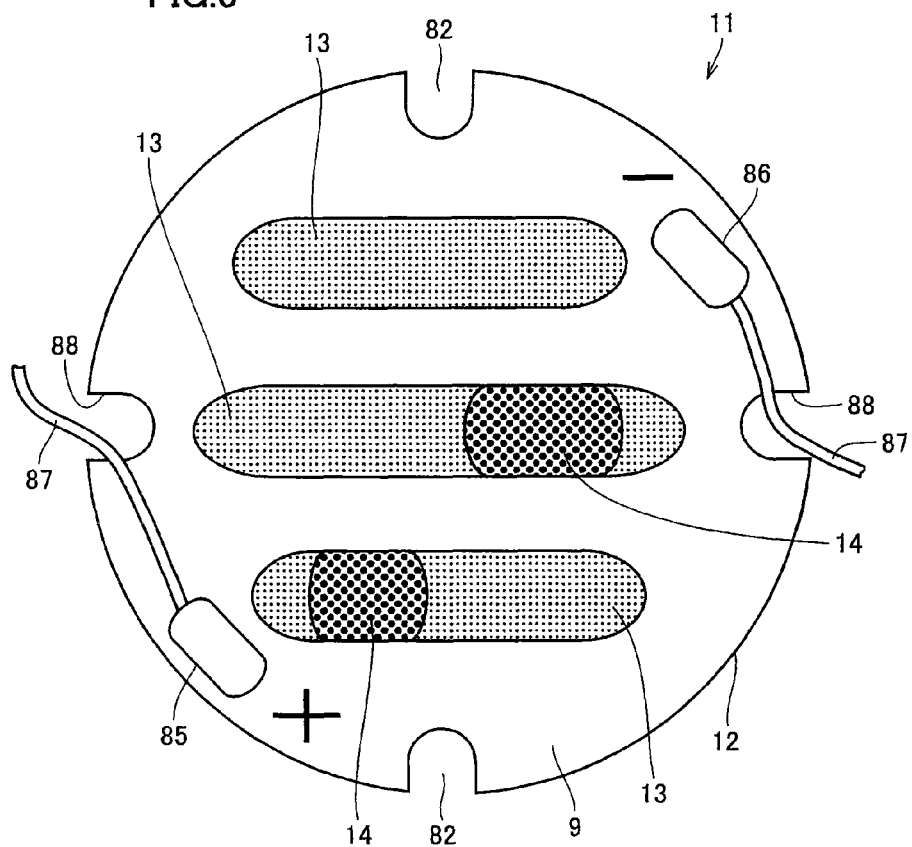
FIG. 3 is a top view schematically showing a light emitting device 11 in accordance with a second preferred example in the case where a light emitting device in accordance with the first aspect of the present invention is realized as a light emitting device in accordance with the second aspect of the present invention.
Figure 4:
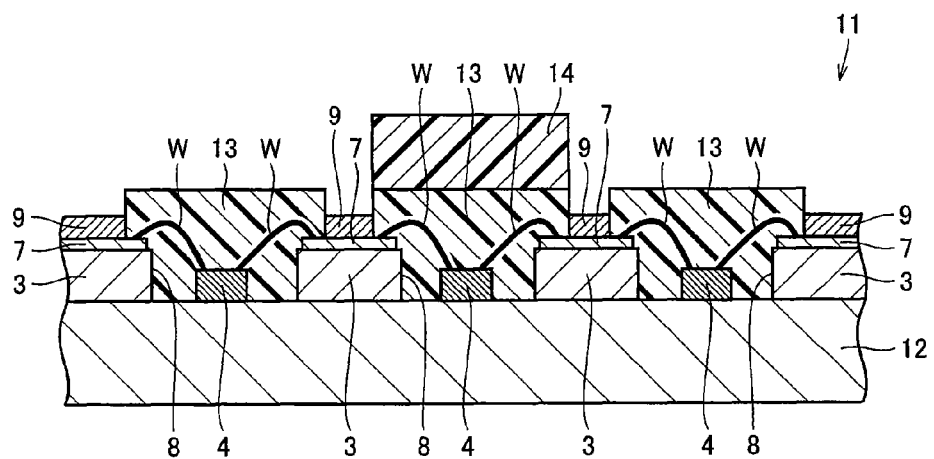
FIG. 4 is a cross-sectional view showing light emitting device 11 in the example of FIG. 3.

FIG. 3 is a top view schematically showing a light emitting device 11 in accordance with a second preferred example in the case where a light emitting device in accordance with the first aspect of the present invention is realized as a light emitting device in accordance with the second aspect of the present invention, and FIG. 4 is a cross-sectional view showing light emitting device 11 in the example of FIG. 3. It should be noted that, since light emitting device 11 in the examples shown in FIGS. 3 and 4 has a similar structure to that of light emitting device 1 in the examples shown in FIGS. 1 and 2 except for one portion, those portions having similar structures are indicated by the same reference numerals, and the description thereof is omitted. In the light emitting device of the present invention, the first sealing member layer may be formed so as to cover a plurality of light emitting elements with the single first sealing member layer. FIGS. 3 and 4 show examples in which light emitting elements 4 are mounted on metal substrate 12 in such a manner as to form a plurality of rows in parallel with one another, as described above (more preferably, light emitting elements 4 mounted to be arranged to form the plurality of rows in parallel with one another, are electrically connected to a wiring pattern through a bonding wire commonly connected between the adjacent rows), with first sealing member layer 13 being formed so as to cover each of the rows of light emitting elements 4 thus mounted. In this manner, by using the arrangement in which each of the rows of light emitting elements 4, mounted to be arranged to form a plurality of rows in parallel with one another, is covered with single first sealing member layer 13, the light emission luminance of light emitting elements 4 linearly arranged is improved to advantageously highlight the linear light emission.

Figure 5:
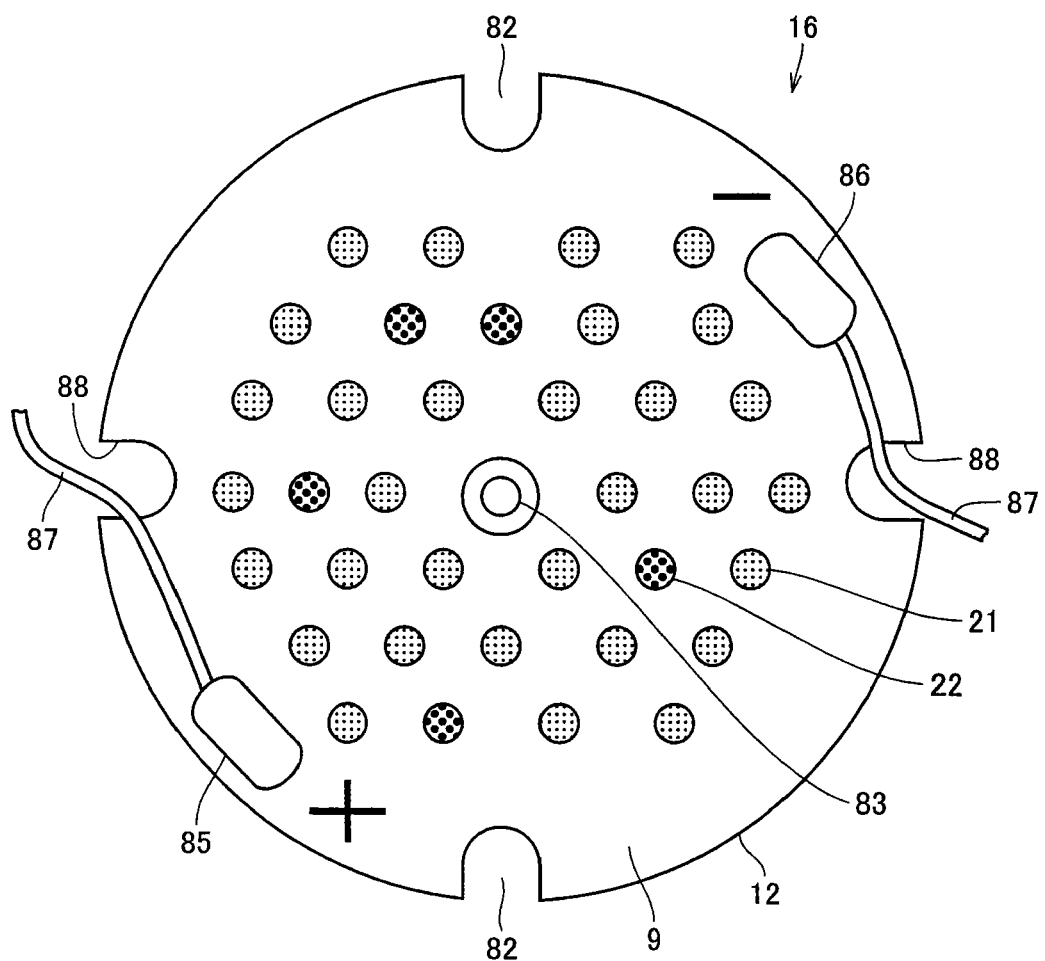
FIG. 5 is a top view schematically showing a light emitting device 16 in accordance with a third preferred example in the case where a light emitting device in accordance with the first aspect of the present invention is realized as a light emitting device in accordance with the second aspect of the present invention.

FIG. 5 is a top view schematically showing a light emitting device 16 in accordance with a third preferred example in the case where a light emitting device in accordance with the first aspect of the present invention is realized as a light emitting device in accordance with the second aspect of the present invention. It should be noted that, since light emitting device 16 of the example shown in FIG. 5, has a similar structure to that of each of light emitting devices 1 and 11 in the examples respectively shown in FIGS. 1 and 3 except for one portion, those portions having similar structures are indicated by the same reference numerals, and the description thereof is omitted. FIG. 5 shows an example in which a plurality of first sealing member layers 21 are formed in such a manner as to cover light emitting elements 4 one by one. In the case where first sealing member layers 21 are formed in such a manner as to cover light emitting elements 4 one by one as described above, the light emission luminance of each of light emitting elements 4 is improved, so that the light emission in the form of spots can be advantageously highlighted.

Figure 27:
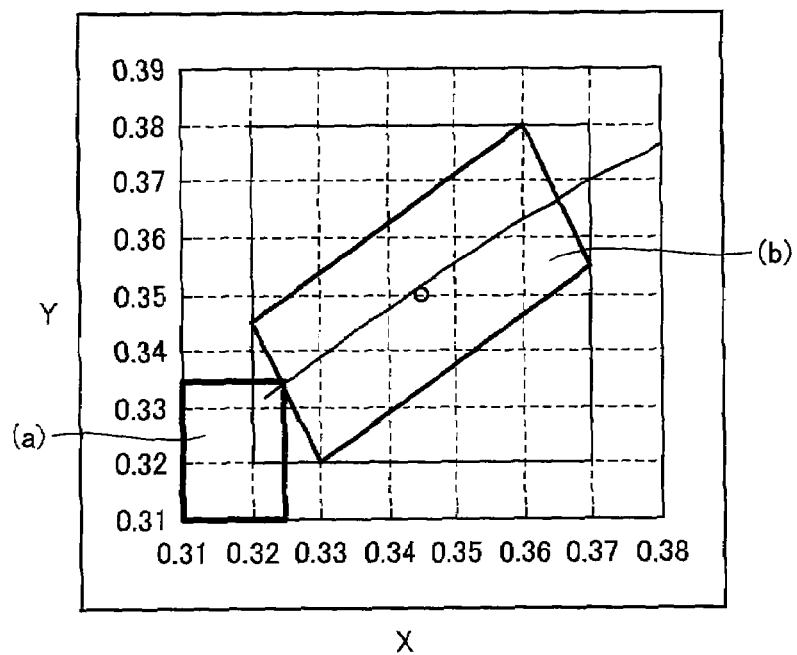
FIG. 27 is a graph showing chromaticity coordinates of CIE.
Figure 28:
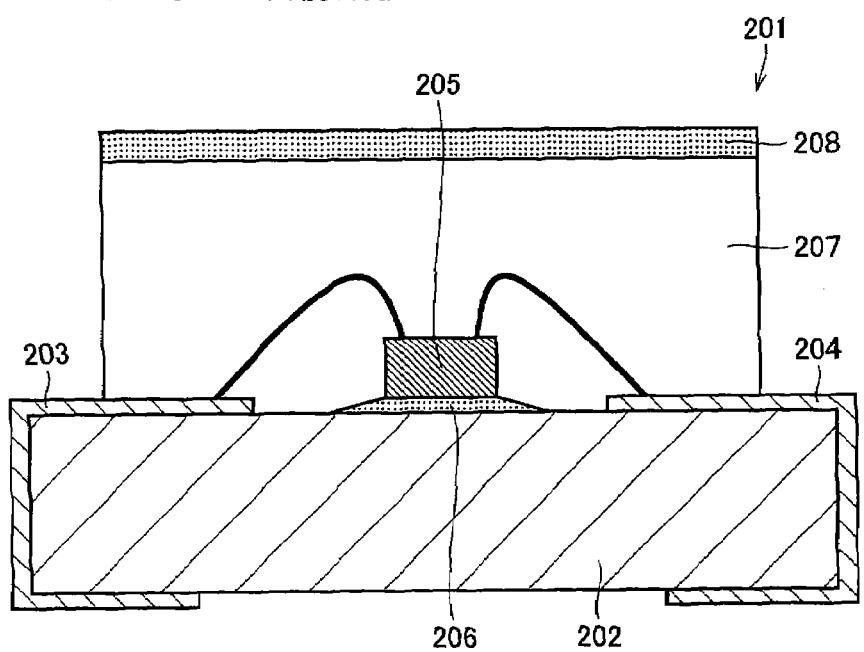
FIG. 28 is a cross-sectional view schematically showing a conventional light emitting diode 201.
Figure 29:
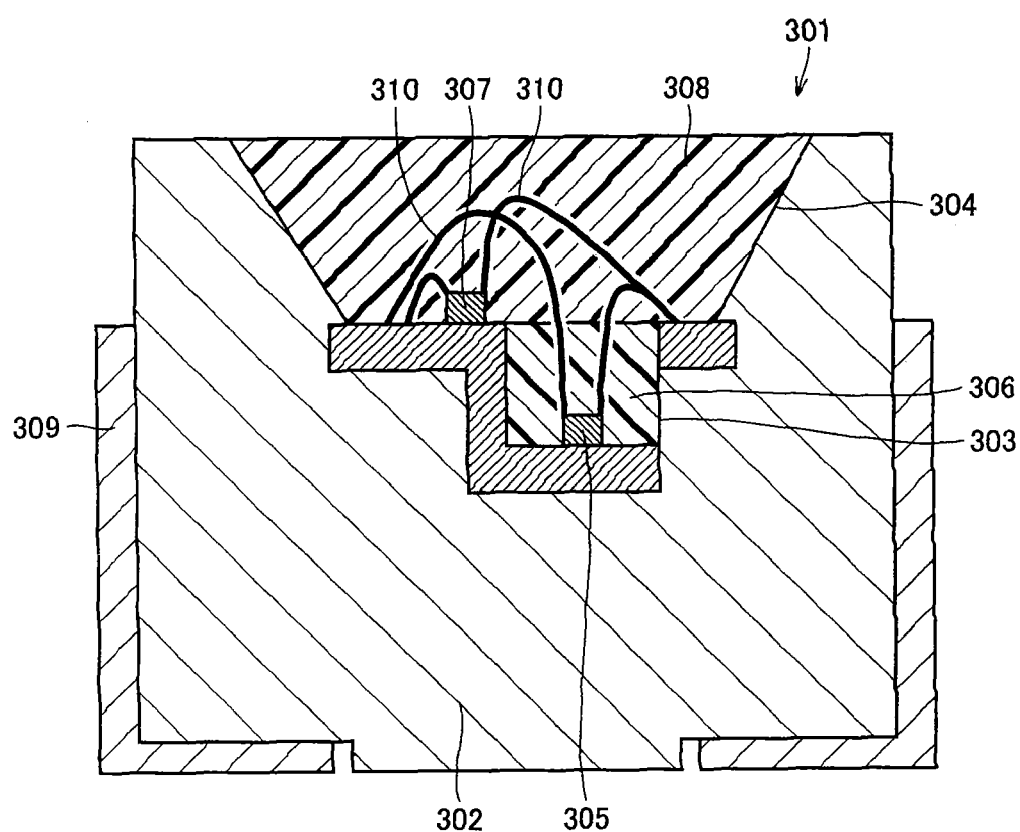
FIG. 29 is a cross-sectional view schematically showing a conventional light emitting device 301.

In the light emitting device in accordance with the second aspect of the present invention, it is only necessary for the second sealing member layer to be formed so as to cover at least one portion of the first sealing member layer. FIGS. 1 and 2 show the examples in which second sealing member layer 6 is formed in such a manner as to cover one region on first sealing member layer 5. Moreover, FIGS. 3 and 4 show the examples in which, of the plurality of first sealing member layers 13 formed so as to cover light emitting elements 4 mounted so as to form a plurality of rows in parallel with one another as described above, on a row to row basis as described above, second sealing member layer 13 is formed so as to partially cover part of first sealing member layers 13. Moreover, FIG. 5 shows the example in which, of the plurality of first sealing member layers 21 formed so as to cover light emitting elements 4 one by one, a plurality of second sealing member layers 22 are formed in such a manner as to cover only part of first sealing member layers 21. In this manner, by forming second sealing member layers 6, 14, and 22 so as to partially cover first sealing member layers 5, 13, and 21 respectively, it is possible to advantageously obtain a light emitting device having a desired chromaticity characteristic (for example, located within a range (b) in FIG. 27 showing chromaticity coordinates, which will be described later). It should be noted that, in this case, a portion of first sealing member layer 5, 13, or 21 to be covered with second sealing member layer 6, 14, or 22 is selected in accordance with a desired chromaticity characteristic (for example, at a portion not located within range (b) in FIG. 27 showing the chromaticity coordinates which will be described later). Moreover, in the case where second sealing member layer 6, 14, or 22 is formed in such a manner as to partially cover first sealing member layer 5, 13, or 21, more than one second sealing member layers may of course be formed (in the examples of FIGS. 1 and 3, two of them are formed, and in the example of FIG. 5, five of them are formed). It should be noted that the border between the first sealing member layer containing the first fluorescent material and the second sealing member layer containing the second fluorescent material may be or may not be clearly separated.

Figure 6:
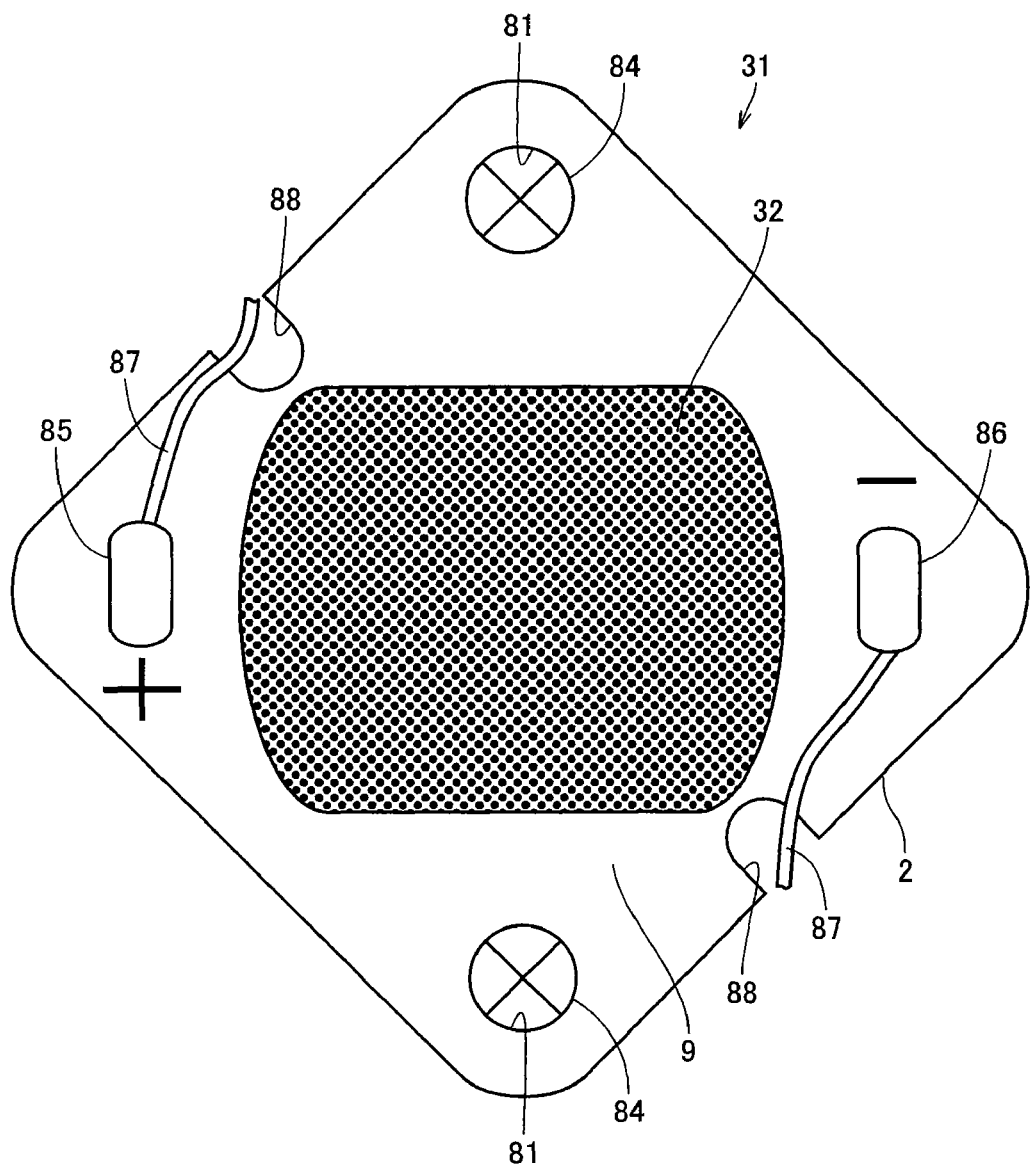
FIG. 6 is a top view schematically showing a light emitting device 31 in accordance with a fourth preferred example in the case where a light emitting device in accordance with the first aspect of the present invention is realized as a light emitting device in accordance with the second aspect of the present invention.
Figure 7:
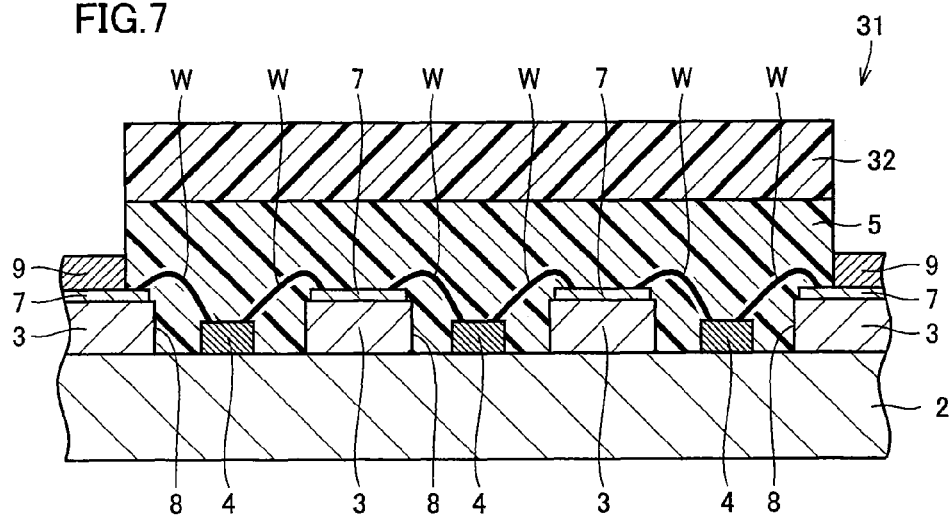
FIG. 7 is a cross-sectional view showing light emitting device 31 in the example of FIG. 6.

FIG. 6 is a top view schematically showing a light emitting device 31 in accordance with a fourth example in the case where a light emitting device in accordance with the first aspect of the present invention is realized as a light emitting device in accordance with the second aspect of the present invention, and FIG. 7 is a cross-sectional view showing light emitting device 31 in the example of FIG. 6. It should be noted that, since light emitting device 31 in the examples shown in FIGS. 6 and 7 has a similar structure to that of light emitting device 1 in the example shown in FIGS. 1 and 2 except for one portion, those portions having similar structures are indicated by the same reference numerals, and the description thereof is omitted. In light emitting device 31 shown in FIGS. 6 and 7, single first sealing member layer 5 is formed so as to cover all light emitting elements 4 in the same manner as in the examples shown in FIGS. 1 and 2; however, a second sealing member layer 32 is formed in such a manner as to cover the entire upper face of first sealing member layer 5. In this manner, by forming second sealing member layers 32 so as to cover the entire first sealing member layer 5, it is possible to advantageously obtain a light emitting device 31 with which the chromaticity of the entire upper face of first sealing member layer 5 is adjusted so as to be located within range (b) in the chromaticity coordinates shown in FIG. 27, which will be described later.

Figure 8:
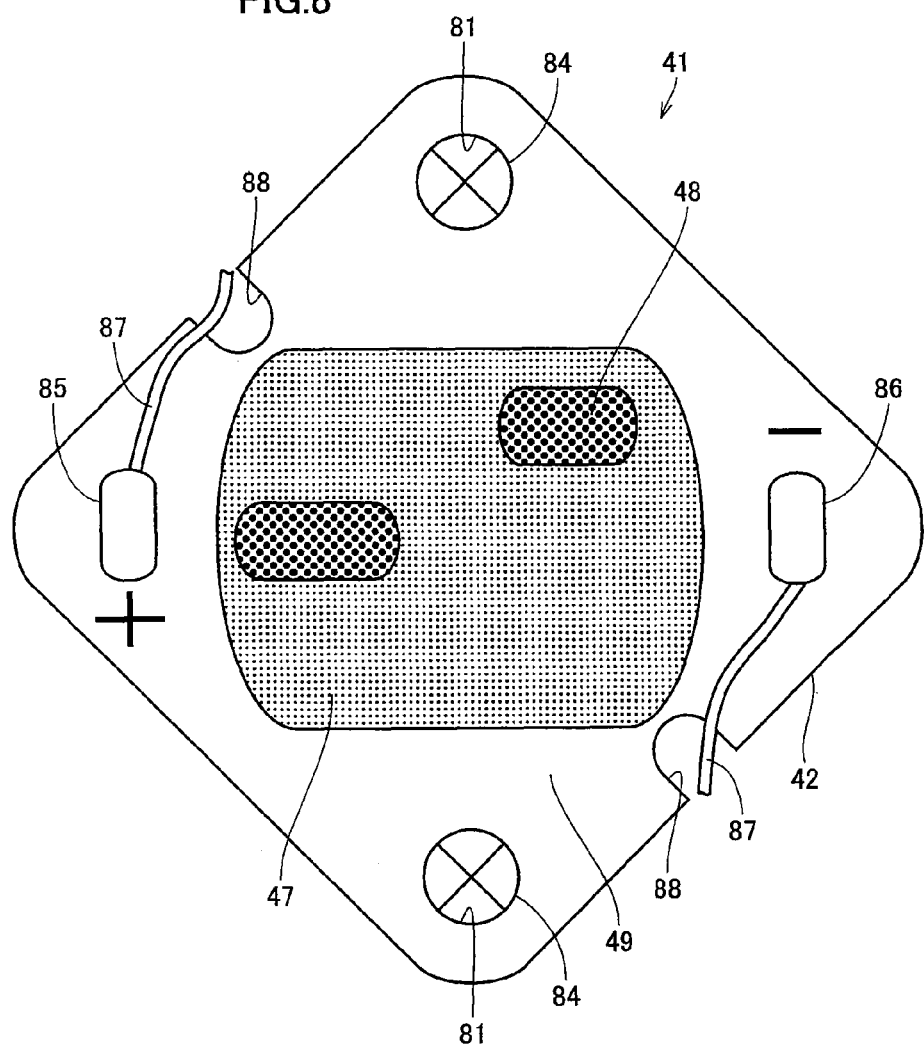
FIG. 8 is a top view schematically showing a light emitting device 41 in accordance with a first example in the case where a light emitting device in accordance with the first aspect of the present invention is realized as a light emitting device in accordance with the third aspect of the present invention.
Figure 9:
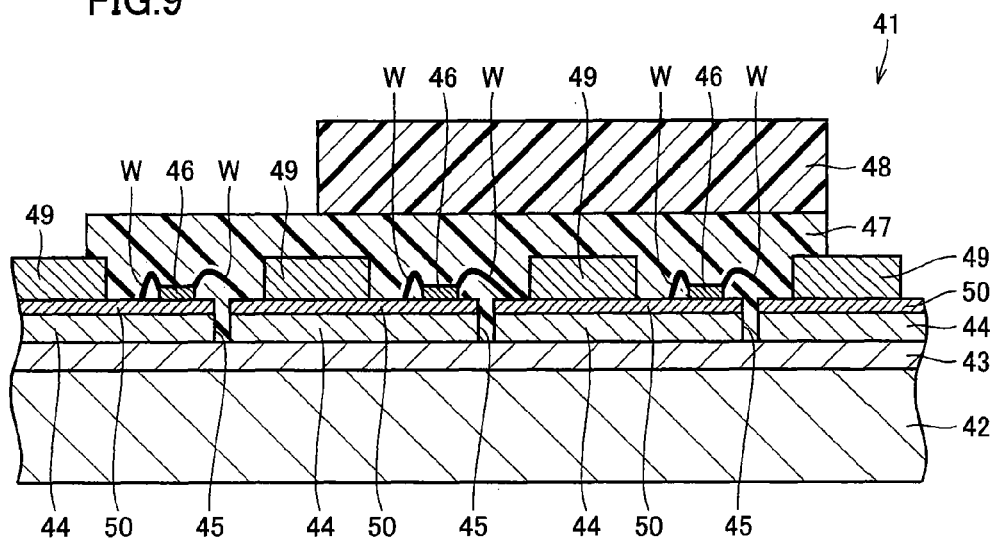
FIG. 9 is a cross-sectional view showing light emitting device 41 in the example of FIG. 8.

Next, a description is given on light emitting device in accordance with a third aspect that is another specific structural example of the light emitting device of the first aspect of the present invention. FIG. 8 is a top view schematically showing a light emitting device 41 in accordance with a first example in the case where a light emitting device in accordance with the first aspect of the present invention is realized as a light emitting device in accordance with the third aspect of the present invention, and FIG. 9 is a cross-sectional view showing light emitting device 41 in the example of FIG. 8. The light emitting device of the third aspect of the present invention is characterized in that, in the above-described basic structure of the light emitting device of the first aspect of the present invention, the substrate is a metal substrate, with an insulating base member being formed on the metal substrate, and metal plates are placed so as to form a spaced portion on the insulating base member, with the light emitting elements being electrically connected to a metal plate, as well as being electrically connected to the adjacent metal plate with the spaced portion interposed therebetween. Light emitting device 41 in accordance with the third aspect of the present invention shown in FIGS. 8 and 9 basically includes an insulating base member 43 formed on a metal substrate 42, metal plates 44 placed on insulating base member 43 so as to form a spaced portion 45, a plurality of light emitting elements 46 mounted on metal plate 44, a first sealing member layer 47 containing a first fluorescent material, and a second sealing member layer 48 containing a second fluorescent material. As shown in FIG. 9, in light emitting device 41 of the third aspect of the present invention, light emitting element 46 is also electrically connected to metal plate 44 adjacent to metal plate 44 on which that light emitting element 46 is mounted. It should be noted that, as shown in FIGS. 8 and 9, in light emitting device 41 in accordance with the third aspect of the present invention, those light emitting elements, each having two electrodes (not shown) on its upper face, are used as light emitting elements 46, and each electrode is electrically connected to each metal plate 44 by using bonding wires W so as to be electrically connected to an external electrode. In the example shown in FIG. 9, a solder resist 49 is provided on any of the region except for the region on metal plates 44 on which light emitting elements 46 are mounted. Moreover, in light emitting device 41 of the third aspect of the present invention, as shown in the example shown in FIG. 9, metal plating 50 is formed on each metal plate 44, and light emitting elements 46 are mounted on this metal plating 50, so that light emitting element 46 is preferably electrically connected to metal plate 44 on which the above-mentioned light emitting element 46 is mounted with this metal plating 50 interposed therebetween, as well as to metal plate 44 adjacent to metal plate 44 on which that light emitting element 46 is mounted with spaced portion 45 interposed therebetween.

As to how to dispose the plurality of light emitting elements 46 in light emitting device 41 in accordance with the third aspect of the present invention also, although not particularly limited, the elements 46 are preferably mounted so as to be aligned into one row in the same manner as in the above-described light emitting device of the second aspect. Moreover, in the case of light emitting device 41 of the third aspect of the present invention as shown in FIGS. 8 and 9, the plurality of light emitting elements 46 are mounted so as to be aligned into one row, and metal plates 44 are preferably placed so as to form spaced portion 45 that is in parallel with the row of the light emitting elements 46. With this structure, there are obtained advantages that the layout of metal plates 44 and spaced portion 45 provides a measure in mounting the light emitting elements and that the light emitting elements can be easily arranged linearly. Moreover, in light emitting device 41 of the third aspect of the present invention also, preferably, the plurality of light emitting elements 46 are arranged and mounted so as to form a plurality of rows in parallel with one another, in the same manner as in the light emitting device of the aforementioned second aspect.

In the same manner as in light emitting device 1 in the examples shown in FIGS. 1 and 2, FIGS. 8 and 9 show the examples in which all light emitting elements 46 are covered with single first sealing member layer 47. In this manner, in light emitting device 41 of the third aspect as well, the same effects as those obtained by covering all light emitting elements 46 with single first sealing member layer 47 can be obtained.

Figure 10:
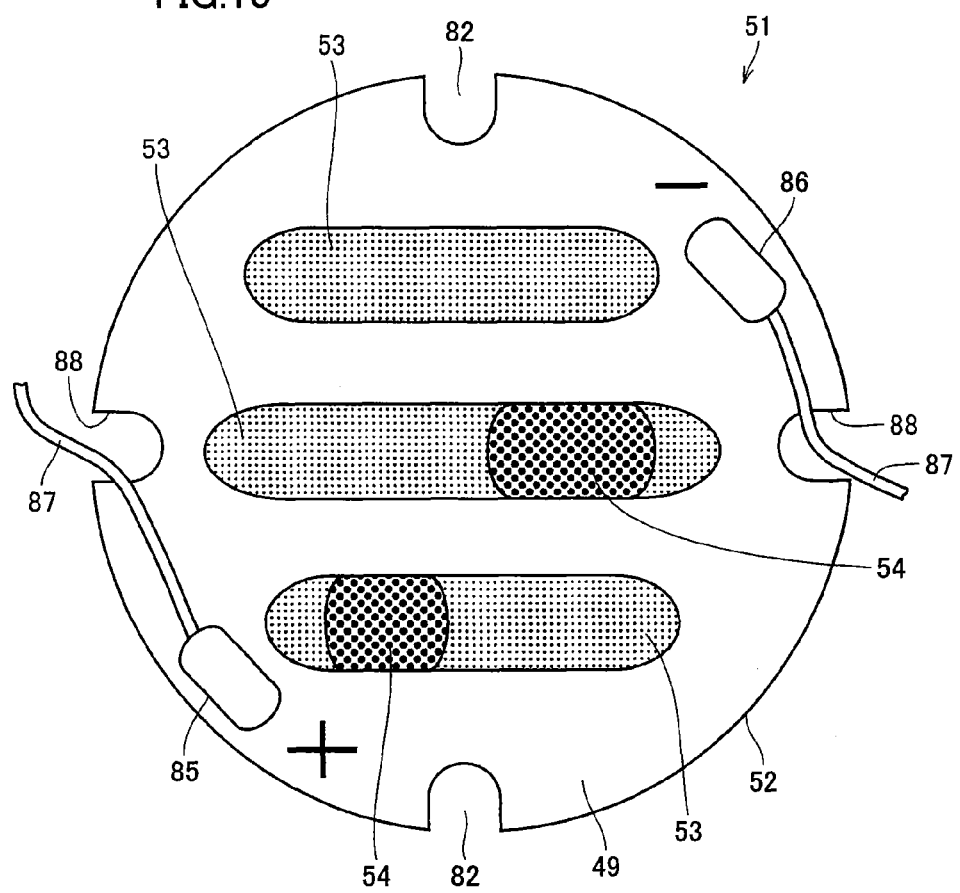
FIG. 10 is a top view schematically showing a light emitting device 51 in accordance with a second example in the case where a light emitting device in accordance with the first aspect of the present invention is realized as a light emitting device in accordance with the third aspect of the present invention.
Figure 11:
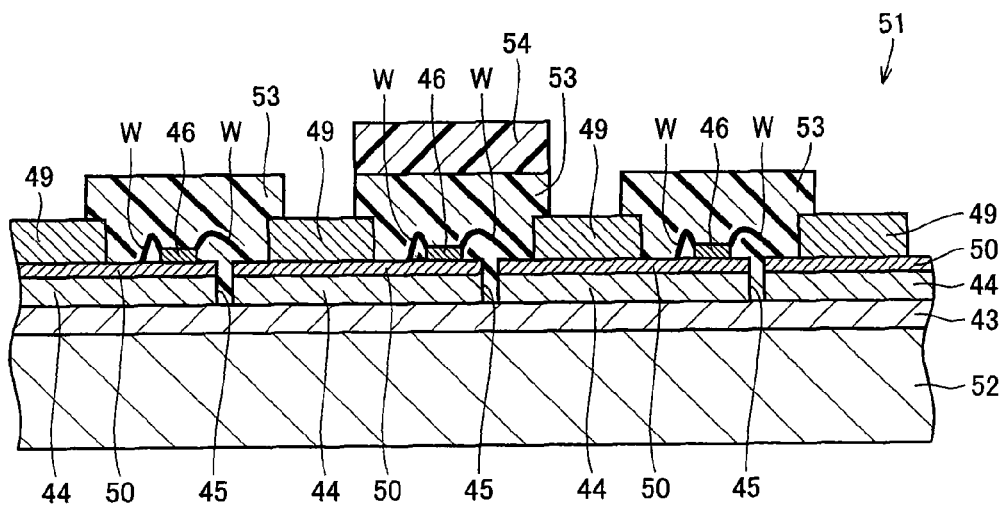
FIG. 11 is a cross-sectional view showing light emitting device 51 in the example of FIG. 10.

FIG. 10 is a top view schematically showing a light emitting device 51 in accordance with a second example in the case where a light emitting device in accordance with the first aspect of the present invention is realized as a light emitting device in accordance with the third aspect of the present invention, and FIG. 11 is a cross-sectional view showing light emitting device 51 in the example of FIG. 10. It should be noted that, since light emitting device 51 in the examples shown in FIGS. 10 and 11 has a similar structure to that of light emitting device 41 in the examples shown in FIGS. 8 and 9 except for one portion, those portions having similar structures are indicated by the same reference numerals, and the description thereof is omitted. FIG. 11 shows an example in which light emitting elements 46 are mounted on metal plates 44 so as to form a plurality of rows in parallel with one another, with metal plating 50 interposed therebetween, and a first sealing member layer 53 is formed so as to cover each of the rows of light emitting elements 46 thus mounted. In this manner, in light emitting device 51 of the third aspect also, by covering each of the rows of light emitting elements 46 arranged and mounted so as to form a plurality of rows in parallel with one another, with a single first sealing member layer 53, the same effects as those achieved in the light emitting device of the second aspect can be obtained.

Figure 12:
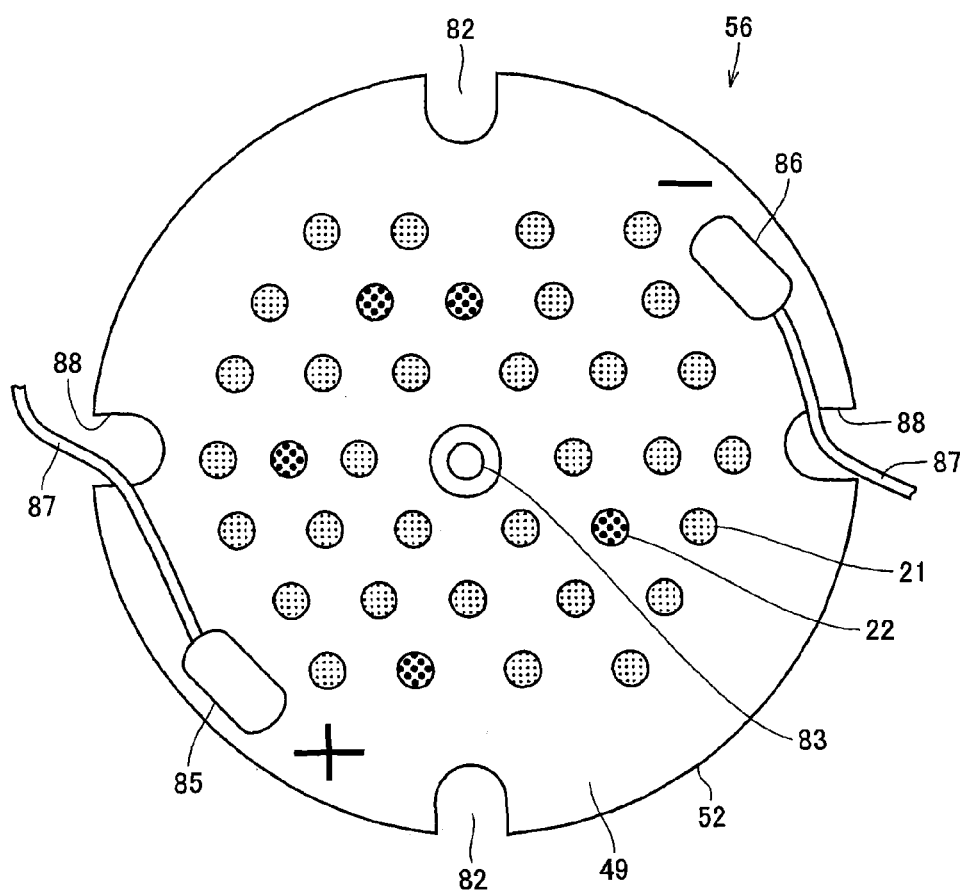
FIG. 12 is a top view schematically showing a light emitting device 56 in accordance with a third preferred example in the case where a light emitting device in accordance with the first aspect of the present invention is realized as a light emitting device in accordance with the third aspect of the present invention.

Moreover, FIG. 12 is a top view schematically showing a light emitting device 56 in accordance with a third preferred example in the case where a light emitting device in accordance with the first aspect of the present invention is realized as a light emitting device in accordance with the third aspect of the present invention. It should be noted that, since light emitting device 56 in the example shown in FIG. 12 has a similar structure to that of light emitting device 16 in the example shown in FIG. 5 except for one portion, those portions having similar structures are indicated by the same reference numerals, and the description thereof is omitted. As shown in the example of FIG. 12, the light emitting device of the third aspect of the present invention may of course have a structure in which first sealing member layers 21 are formed to cover light emitting elements one by one. In this case, in the same manner as in light emitting device 16 of the example shown in FIG. 5, the light emission luminance of each of individual light emitting elements 4 is improved, so that the light emission in the form of spots can be advantageously highlighted.

Figure 13:
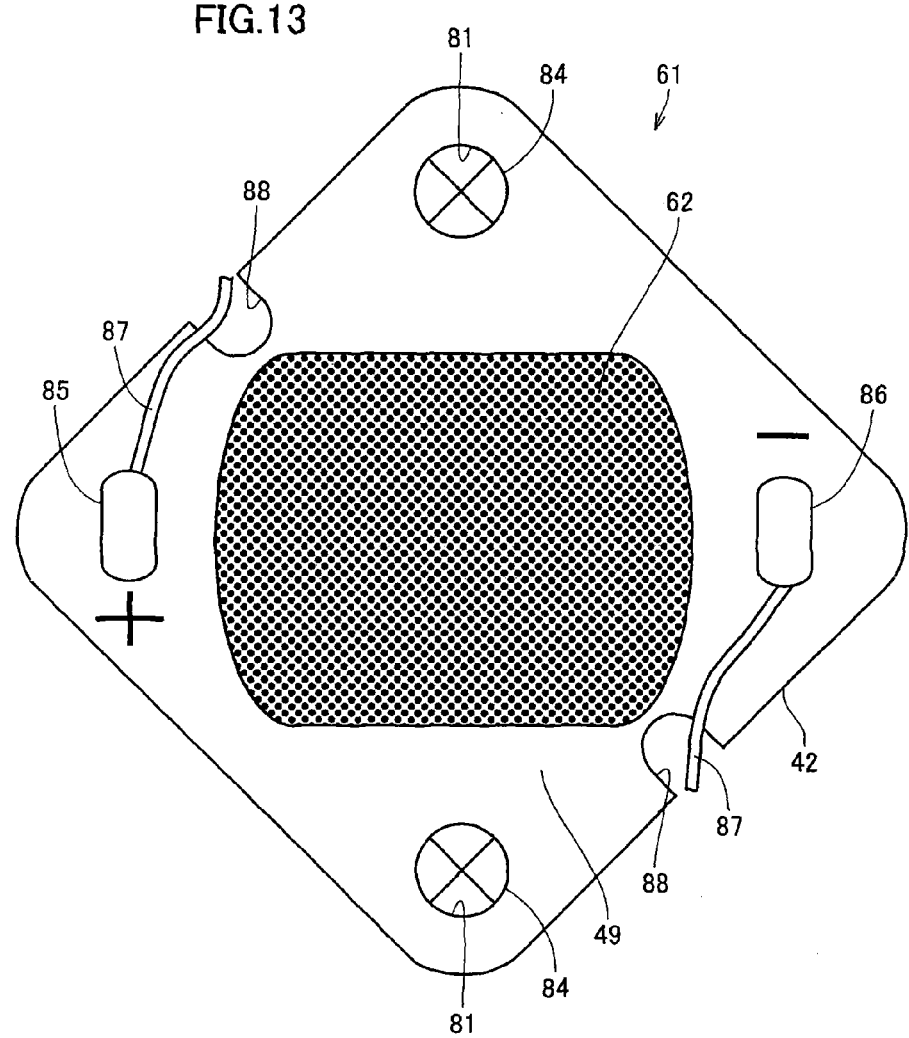
FIG. 13 is a top view schematically showing a light emitting device 61 in accordance with a fourth example in the case where a light emitting device in accordance with the first aspect of the present invention is realized as a light emitting device in accordance with the third aspect of the present invention.
Figure 14:
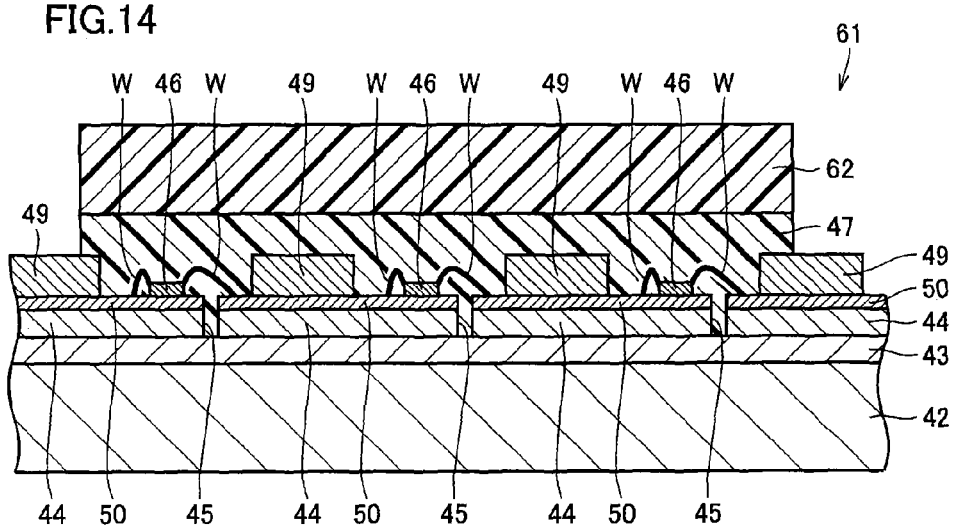
FIG. 14 is a cross-sectional view showing light emitting device 61 in the example of FIG. 13.

Furthermore, FIG. 13 is a top view schematically showing a light emitting device 61 in accordance with a fourth example in the case where a light emitting device in accordance with the first aspect of the present invention is realized as a light emitting device in accordance with the third aspect of the present invention, and FIG. 14 is a cross-sectional view of light emitting device 61 of the example shown in FIG. 13. It should be noted that, since light emitting device 61 in the example shown in FIGS. 13 and 14 has a similar structure to that of light emitting device 41 in the example shown in FIGS. 8 and 9 except for one portion, those portions having similar structures are indicated by the same reference numerals, and the description thereof is omitted. Light emitting device 61 of the example shown in FIGS. 13 and 14 is similar to that of the example shown in FIG. 9 in that a single first sealing member layer 47 is formed in such a manner as to cover all light emitting elements 46; however, a second sealing member layer 62 is formed so as to cover the entire upper face of first sealing member layer 47. In this manner, by realizing a similar structure to that of light emitting device 31 of the second aspect shown in FIGS. 6 and 7 also in the light emitting device of the third aspect as shown in FIGS. 13 and 14, similar effects as those described above can be obtained.

In the light emitting device of the present invention, although not particularly limited, the shape of the first sealing member layer is preferably formed to have a top shape of a rectangular shape, a hexagonal shape, a round shape, or a top shape with a plurality of straight line portions. Note that the top shape of the first sealing member layer refers to the cross-sectional shape on a plane in parallel with the metal substrate of the first sealing member layer. In each of above-described light emitting devices 1, 31, 41, and 61 of the examples shown in FIGS. 1, 6, 8, and 13, first sealing member layer 5 or 47 has a rectangular top shape, and in the case where first sealing member layer 5 or 47 is formed so as to have such a rectangular top shape, regions that allow securing holes and holes for external wirings, which will be described later, to be formed therein are advantageously ensured. Moreover, in each of light emitting devices 11 and 51 in the examples shown in FIGS. 3 and 10, each of first sealing member layers 13 and 53 has a top shape with a plurality of linear portions, and in the case where each of first sealing member layers 13 and 53 is formed so as to have the top shape with a plurality of linear portions, it is possible to obtain the advantages that the light emission luminance of the light emitting elements disposed linearly is improved, and that the light emission is highlighted linearly.

Figure 15:
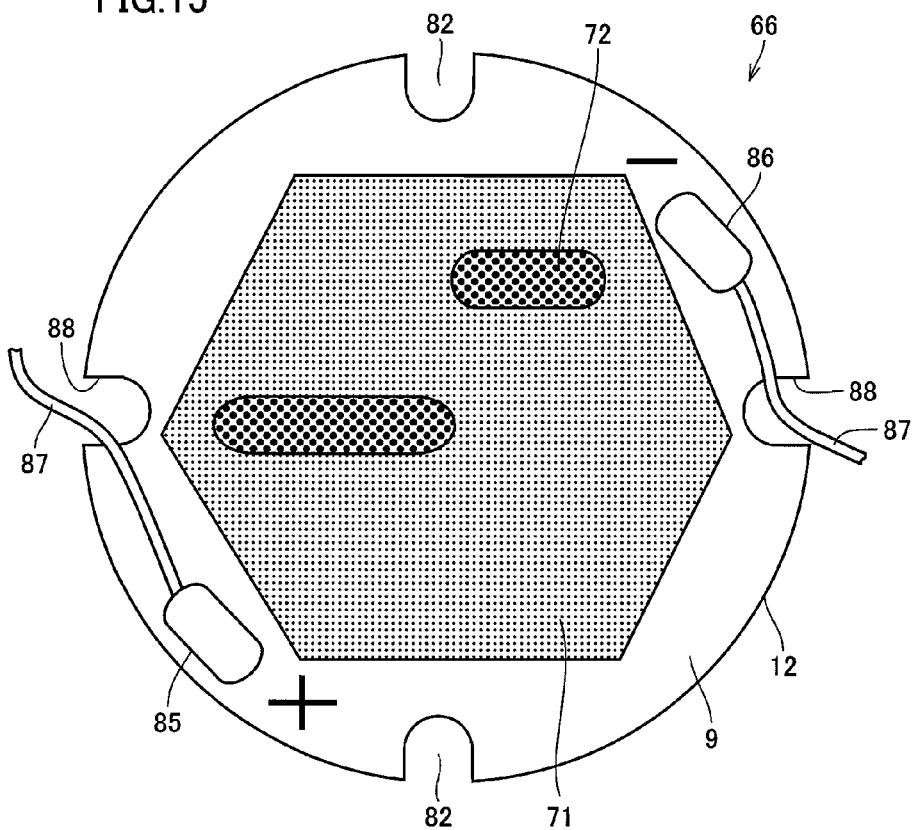
FIG. 15 is a top view schematically showing a light emitting device 66 in accordance with a fifth preferred example in the case where a light emitting device in accordance with the first aspect of the present invention is realized as a light emitting device in accordance with the second aspect of the present invention.
Figure 16:
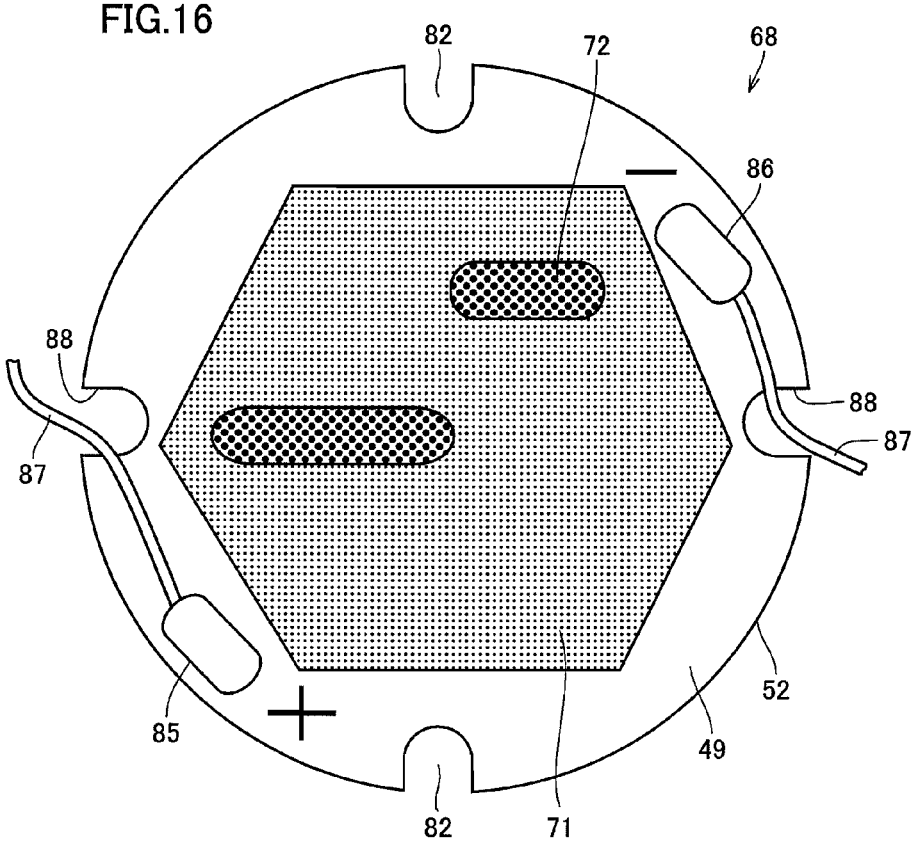
FIG. 16 is a top view schematically showing a light emitting device 68 in accordance with the fifth preferred example in the case where a light emitting device in accordance with the first aspect of the present invention is realized as a light emitting device in accordance with the third aspect of the present invention.

FIG. 15 is a top view schematically showing a light emitting device 66 in accordance with a fifth preferred example in the case where a light emitting device in accordance with the first aspect of the present invention is realized as a light emitting device in accordance with the second aspect of the present invention, and FIG. 16 is a top view schematically showing a light emitting device 68 in accordance with the fifth preferred example in the case where a light emitting device in accordance with the first aspect of the present invention is realized as a light emitting device in accordance with the third aspect of the present invention. It should be noted that, since light emitting devices 66 and 68 in the examples shown in FIGS. 15 and 16 respectively have similar structures to those of light emitting devices 11 and 51 in the examples shown in FIGS. 3 and 10 respectively except for one portion, those portions having similar structures are indicated by the same reference numerals, and the description thereof is omitted. FIGS. 15 and 16 show light emitting devices 66 and 68 respectively in the case where a first sealing member layer 71, which has a hexagonal shape in top view, is formed so that the entire light emitting elements (not shown) are covered with this single first sealing member layer, and a second sealing member layer 72 is formed in such a manner as to partially cover first sealing member layer 71. It should be noted that, as shown in the examples of FIGS. 15 and 16, when first sealing member layer 71 is formed to have a hexagonal shape in top view, the resulting symmetrical shape advantageously provides good light directivity.

Figure 17:
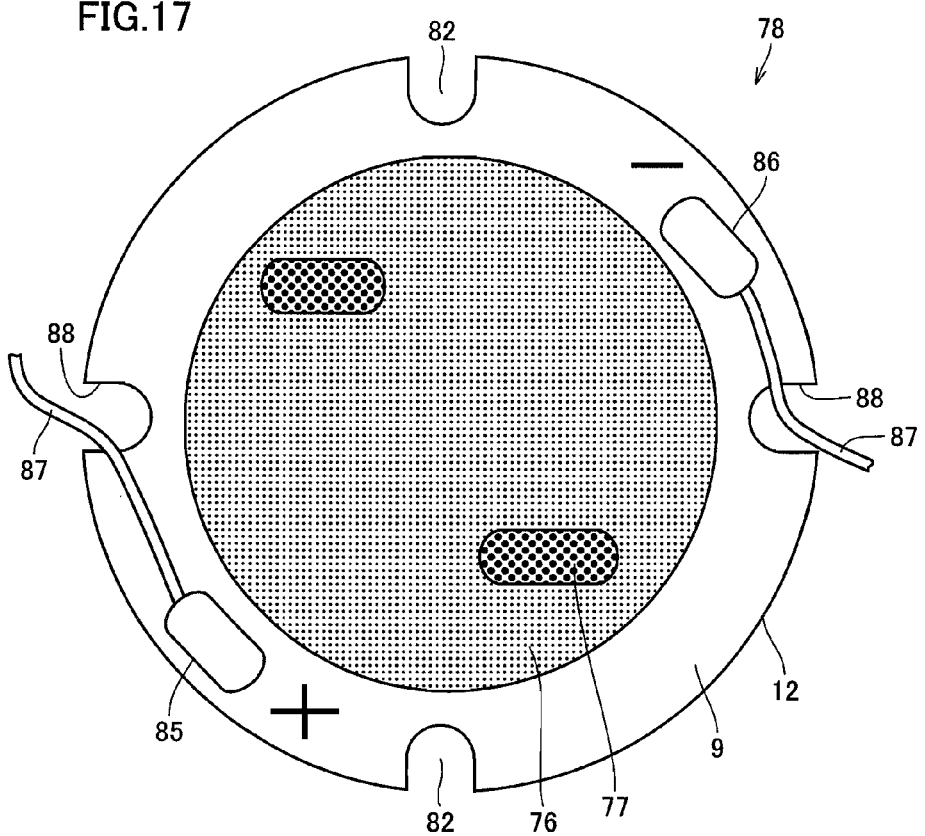
FIG. 17 is a top view schematically showing a light emitting device 78 in accordance with a sixth preferred example in the case where a light emitting device in accordance with the first aspect of the present invention is realized as a light emitting device in accordance with the second aspect of the present invention.
Figure 18:
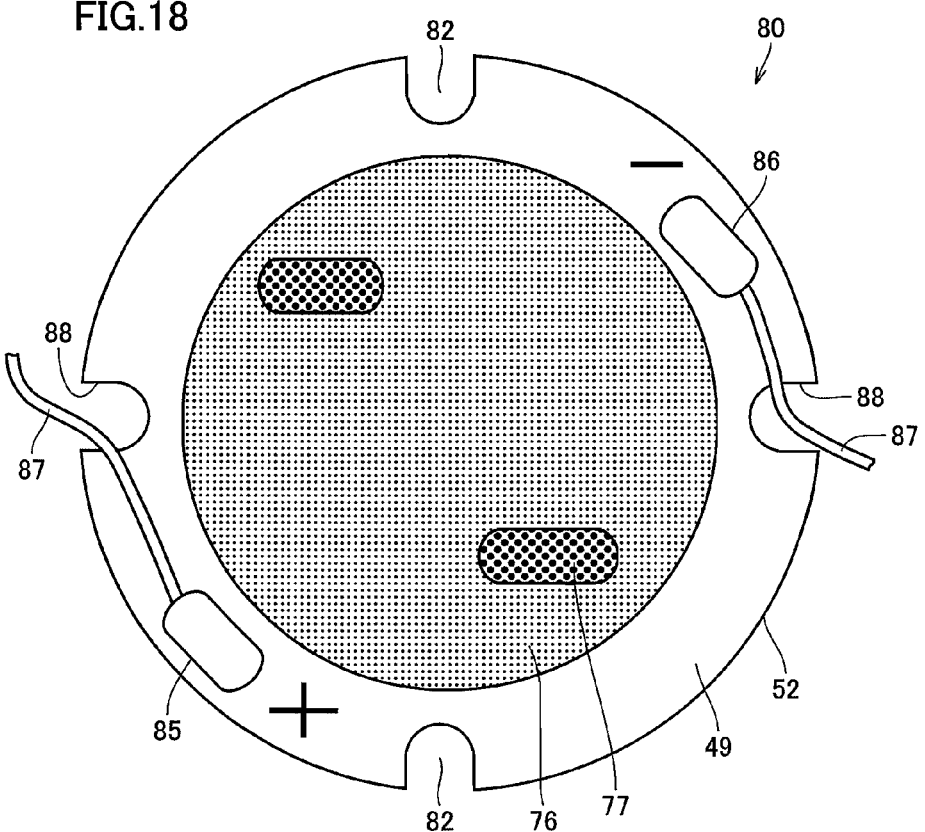
FIG. 18 is a top view schematically showing a light emitting device 80 in accordance with the sixth preferred example in the case where a light emitting device in accordance with the first aspect of the present invention is realized as a light emitting device in accordance with the third aspect of the present invention.

Moreover, FIG. 17 is a top view schematically showing a light emitting device 78 in accordance with a sixth preferred example in the case where a light emitting device in accordance with the first aspect of the present invention is realized as a light emitting device in accordance with the second aspect of the present invention, and FIG. 18 is a top view schematically showing a light emitting device 80 in accordance with the sixth preferred example in the case where a light emitting device in accordance with the first aspect of the present invention is realized as a light emitting device in accordance with the third aspect of the present invention. It should be noted that, since light emitting devices 78 and 80 in the examples shown in FIGS. 17 and 18 respectively have similar structures to those of light emitting devices 11 and 51 in the examples shown in FIGS. 3 and 10 respectively except for one portion, those portions having similar structures are indicated by the same reference numerals, and the description thereof is omitted. FIGS. 17 and 18 respectively show light emitting devices 78 and 80 in accordance with the first aspect in the case where a first sealing member layer 76, which has a round shape in top view, is formed so that the entire light emitting elements (not shown) are covered with this single first sealing member layer, and a second sealing member layer 77 is formed in such a manner as to partially cover first sealing member layer 76. Moreover, FIGS. 5 and 12 respectively show above-described light emitting devices 16 and 56 in the case where first sealing member layer 21, formed in such a manner as to cover the light emitting elements one by one, has a round shape in top view. As shown in the examples of FIGS. 5, 12, 17, and 18 respectively, when each of first sealing member layers 21 and 76 is formed to have a round shape in top view, the resulting symmetrical shape advantageously provides good light directivity.

Moreover, the first sealing member layer and/or the second sealing member layer in the light emitting device of the present invention may be formed into a hemispherical shape with an upward convex portion. In this case, the first sealing member layer and/or the second sealing member layer can have a function as a lens.

Although not particularly limited, the entire shape of light emitting device of the present invention is preferably designed to have a hexagonal shape, a round shape, a rectangular shape, or a square shape in top view. Note that the cross-sectional shape of the light emitting device refers to a cross-sectional shape on a plane in parallel with the substrate face of the substrate. In the case where the light emitting device has a rectangular or a square top shape, since the light emitting device can be disposed in a tight contact state, the resulting light emitting device is preferably applied to a fluorescent lighting-type LED lamp. Moreover, in the case where the light emitting device is applied to a light-bulb-type LED lamp (which will be described later), the light emitting device is preferably designed to have a round top shape. Also, in the case where problematic bright spot light emission occurs, the light emitting device is preferably designed to have a hexagonal shape, a rectangular shape, or a square shape in top view. FIGS. 1, 6, 8, and 13 respectively show light emitting devices 1, 31, 41, and 61 in the case where the devices are designed to have a square top shape. Moreover, FIGS. 3, 5, 10, 12, 15, 16, 17, and 18 respectively show light emitting devices 11, 16, 51, 56, 66, 68, 78, and 80 in the case where the devices are designed to have a round top shape.

In accordance with the present invention, it is possible to provide a light emitting device capable of suppressing color shifts and the like and also of being easily manufactured; therefore, it is particularly suitably used as a backlight light source of a liquid crystal display or a light source for illumination. By using the light emitting device of the present invention, it is possible to achieve the light source having a desired color tone including white color, such as a light bulb color.

In order to provide for the above-mentioned application, the light emitting device of the present invention normally has securing holes for attachment and securing to a matching member. In light emitting devices 1, 31, 41, and 61 having a square top shape shown in FIGS. 1, 6, 8, and 13, securing holes 81, formed so as to penetrate metal substrate 2 or 42, are disposed one by one on each opposing corner of metal substrate 2 or 42 having a square top shape, on the diagonal line. Moreover, in light emitting devices 11, 16, 51, 56, 66, 68, 78, and 80, each having a round top shape, shown in FIGS. 3, 5, 10, 12, 15, 16, 17, and 18, securing holes 82, each formed as a cut-out section, are respectively formed and disposed one by one on a straight line passing through the center of metal substrate 12 or 52 having a round top shape. Moreover, in the case where first sealing member layer 21 and second sealing member layer 22 are formed so as to cover the light emitting elements one by one as shown in light emitting devices 16 and 56 of the examples shown in FIGS. 5 and 12, an arrangement may be made such that, without mounting light emitting elements in a region near the center of metal substrate 12 or 52 having a round top shape, a positioning hole 83 may be provided in this region near the center.

In order to provide for the above-mentioned application, the light emitting device of the present invention is attached to a matching member to be secured thereto by using a securing jig. With respect to the securing jig, for example, a securing jig 84, as shown in FIGS. 1, 6, 8, and 13, which is a screw to be inserted into each securing hole 81 with a threaded inner wall and engaged therewith, is used. Moreover, the securing jig may be an adhesive sheet or the like.

Figure 19:
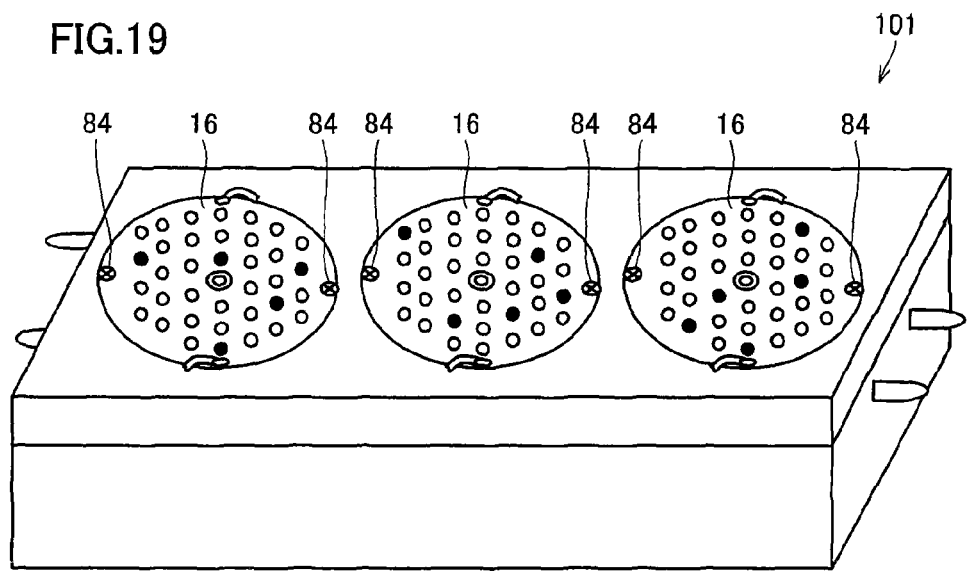
FIG. 19 is a perspective view showing a case in which light emitting device 16 of the example shown in FIG. 5 is applied to a fluorescent-lighting-type LED lamp 101.
Figure 20:
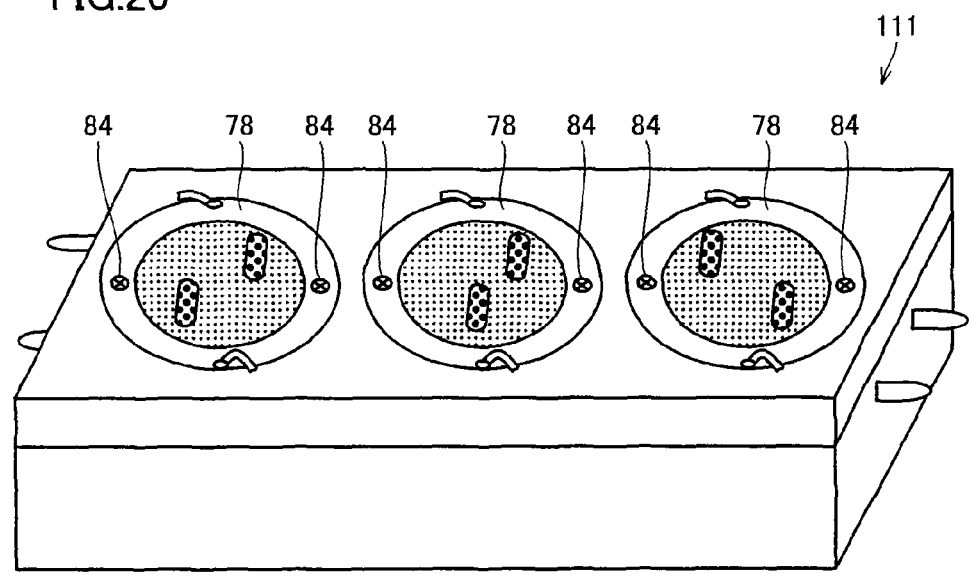
FIG. 20 is a perspective view showing a case in which light emitting device 78 of the example shown in FIG. 17 is applied to a fluorescent-lighting-type LED lamp 111.
Figure 21:
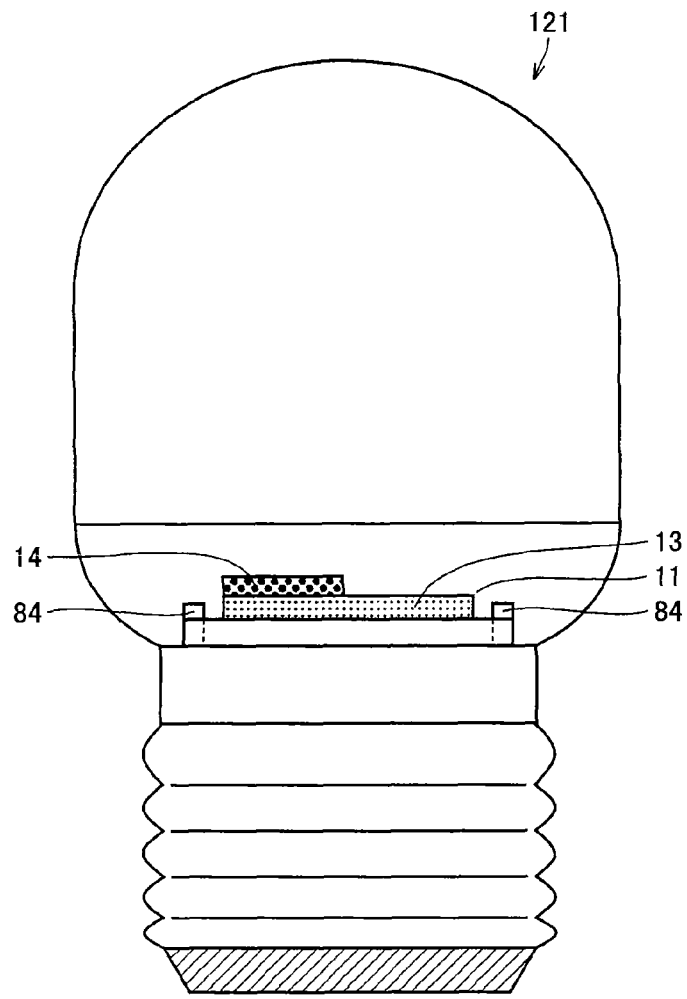
FIG. 21 is a cross-sectional view showing a case in which light emitting device 11 of the example shown in FIG. 3 is applied to a light-bulb-type LED lamp 121.
Figure 22:
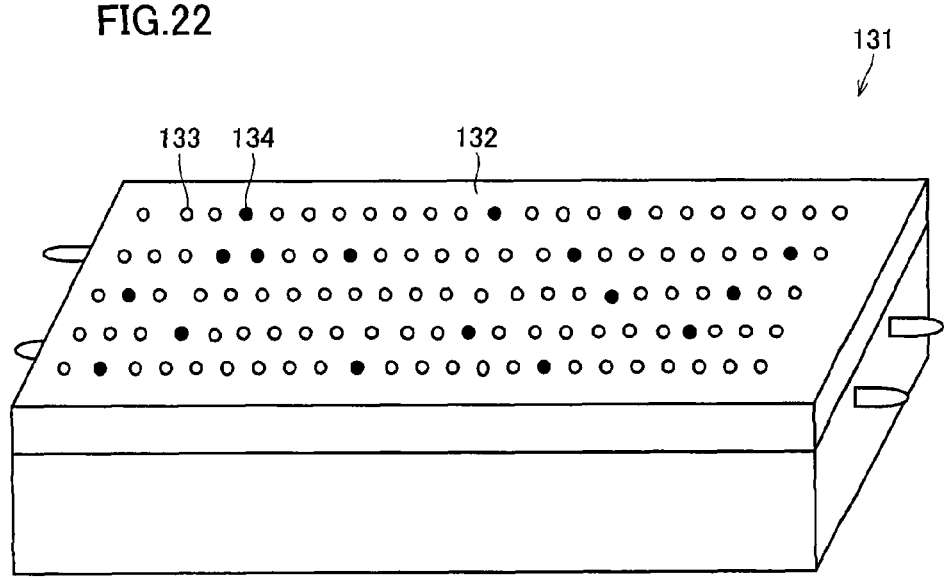
FIG. 22 is a perspective view showing a case in which the light emitting device of the present invention is applied to a fluorescent-lighting-type LED lamp 131.

FIGS. 19 to 22 show examples in which the light emitting device of the present invention is used as a light source for illumination. FIG. 19 is a perspective view showing a case in which light emitting device 16 of the example shown in FIG. 5 is applied to a fluorescent lighting-type LED lamp 101, FIG. 20 is a perspective view showing a case in which light emitting device 78 of the example shown in FIG. 17 is applied to a fluorescent lighting-type LED lamp 111, and FIG. 21 is a cross-sectional view showing a case in which light emitting device 11 of the example shown in FIG. 3 is applied to a light bulb-type LED lamp 121. As shown in FIGS. 19 to 21, each of light emitting devices 16, 78, and 11 is attached through securing hole 82 and secured by using securing jig 84. Moreover, FIG. 22 is a perspective view showing a case in which the light emitting device of the present invention is applied to a fluorescent lighting-type LED lamp 131, and as shown in the example of FIG. 22, by using an attaching face 132 of the matching member as the metal substrate, light emitting elements may be directly mounted thereon, and may be sealed by a first sealing member layer 133 and a second sealing member layer 134.

It should be noted that, as shown in each of FIGS. 1, 3, 5, 6, 8, 10, 12, 13, 15, 16, 17, and 18, the light emitting device of the present invention is preferably designed to have a structure in which a positive electrode externally connecting land 85 and a negative electrode externally connecting land 86 are provided on insulating substrate 2, 12, 42, or 52 as external electrodes, with externally connecting wires 87 used for electrically connecting these positive electrode externally connecting land 85 and negative electrode externally connecting land 86 to a power supply (not shown) being provided thereto. The light emitting elements are electrically connected to these positive electrode externally connecting land 85 and negative electrode externally connecting land 86.

Moreover, as shown in each of FIGS. 1, 3, 5, 6, 8, 10, 12, 13, 15, 16, 17, and 18, the light emitting device of the present invention is preferably designed to have a structure in which external wiring holes 88 which allow external connection wires 87 to pass therethrough are formed on metal substrate 2, 12, 42, or 52. In the examples shown in FIGS. 1, 6, 8, and 13, on metal substrate 2 or 42 having a square top shape, positive electrode externally connecting land 85 and negative electrode externally connecting land 86 are provided to be disposed on another diagonal line that is different from the diagonal line on which the aforementioned securing holes 81 are provided, and external wiring holes 88, each having a cut-out shape, are formed on opposing two sides near the center thereof of metal substrate 2 or 42. Moreover, in the examples shown in FIGS. 3, 5, 10, 12, 15, 16, 17, and 18, on metal substrate 12 or 52 having a round top shape, external wiring holes 88, each having a cut-out shape, are formed on a straight line that passes through the center and is virtually perpendicular to the straight line passing through the center on which securing holes 82 are formed as described above, and positive electrode externally connecting land 85 and negative electrode externally connecting land 86 are provided between securing holes 82 and external wiring holes 88 so as to oppose each other. It should be noted that, as shown in each of the examples of FIGS. 3, 5, 10, 12, 15, 16, 17, and 18, in the case where securing holes 82 and external wiring holes 88 are formed as cut-out sections on metal substrate 12 or 52, each having a round top shape, the resulting structure also exerts a rotation-stopping function for preventing the light emitting device from rotating in a circumferential direction in an attached state to the matching member.

With respect to the light emitting elements to be used for the light emitting device of the present invention, light emitting elements that are normally used in the field can be used without particular limitation. Examples of such a light emitting element include semiconductor light emitting elements, such as a blue-color-based LED (light emitting diode) chip made by growing a material such as a gallium nitride-based compound semiconductor, a ZnO (zinc oxide)-based compound semiconductor, an InGaAlP-based compound semiconductor, or an AlGaAs-based compound semiconductor on a substrate such as a sapphire substrate, a ZnO (zinc oxide) substrate, a GaN substrate, a Si substrate, a SiC substrate, or a spinel substrate. Among these, since a one-sided structure with two electrodes can be easily formed on an insulating substrate and since a nitride semiconductor having good crystallinity can be formed with high mass productivity, a blue-color-based LED made by growing a gallium nitride-based compound semiconductor on a sapphire substrate, is preferably used as the light emitting element. In the case where such a blue-color-based LED is used as the light emitting element, the light emitting device is preferably designed so as to obtain white color by dispersing a fluorescent material that is excited by light from the semiconductor light emitting element to emit yellowish light in a sealing member (which will be described later). It should be noted that, with respect to the light emitting elements used for the light emitting device of the present invention, the color of light emission is not limited to blue-color light emission, and light emitting elements having a light-emission color, such as ultraviolet light emission and green-color light emission, may of course be used.

With respect to the light emitting element to be used for the light emitting device of the present invention, each of FIGS. 2, 4, 7, 9, 11, and 14 shows a case in which light-emitting elements, each having two electrodes on its upper face, are used (that is, a P-side electrode and an N-side electrode are formed on one of faces, and the elements are mounted with that face as the upper face). In this case, as shown in FIGS. 2, 4, 7, 9, 11, and 14, the P-side electrode and the N-side electrode can be electrically connected to each other by using a bonding wire W. The light emitting device of the present invention may of course use a light emitting element, with each one electrode being placed on the upper and lower faces. In this case, for example, the light emitting element, with a P-side electrode formed on one of faces and an N-side electrode formed on the opposite face, is mounted with one of the electrodes serving as an upper face, and electrical connection may be made on the electrode disposed on the upper face by using a single bonding wire. It should be noted that, in this case, the lower face which has the electrodes of the light emitting elements formed thereon is joined by using an adhesive agent having a conductivity, such as AuSn and an Ag paste.

The bonding wire W to be used for electrically connecting the light emitting elements in the light emitting device of the present invention is not particularly limited, and any of metal thin wires conventionally used in the field may be used. Examples of the metal thin wires include a gold wire, an aluminum wire, a copper wire, and a platinum wire, and among these, the gold wire, which is less likely to corrode, superior in moisture resistance, environmental resistance, adhesion, electrical conductivity, thermal conductivity, and elongation percentage, and easily formed into a ball, is preferably used as the bonding wire W.

With respect to the metal substrate, insulating base member, metal plate, metal plating, first sealing member layer, second sealing member layer, and the like that constitute the light emitting device of the present invention, those conventional members and materials that are widely used in the field may be adopted appropriately.

With respect to the metal substrate, although not particularly limited, for example, a substrate made of at least one metal material selected from aluminum, copper, and iron, may be used. Among these, a metal substrate made of aluminum is preferably used because it has good thermal conductivity and high light reflectance.

The insulating base member is not particularly limited, and any member may be used as long as it is formed into a layer by using a material having an insulating property, such as polyimide. It should be noted that, with respect to the insulating base member used for the above-described light emitting device of the second aspect of the present invention, any member, which has through holes formed in accordance with desired light emission and a proper wiring pattern (for example, formed by a material such as a gold foil film or a copper foil film prepared by performing plating on copper) formed on the surface thereof, is preferably used.

In the above-described light emitting device in accordance with the third aspect of the present invention, with respect to the metal plates to be placed so as to form a spaced portion on the insulating base member, although not particularly limited, for example, a plate-shaped member formed of metal such as copper may be used. Moreover, in the light emitting device in accordance with the third aspect of the present invention, with respect to the metal plating to be formed on the metal plates, although not particularly limited, plating using metal such as silver or gold may be used, for example. Among the metals for plating, silver plating is preferably used because it has high light reflectance. In forming the metal plating, the metal plating may be formed with a mask having a shape corresponding to a desired wiring pattern being placed on the metal plates; thus, the metal plating is formed on the metal plates so as to have a desired wiring pattern.

The material (sealing material) used for forming the first sealing member layer and the second sealing member layer in the light emitting device of the present invention is not particularly limited as long as it has a light-transmitting property, and any conventionally known material in the field may be appropriately used. Preferable examples of the sealing material include light-transmitting resin materials having superior weather resistance, such as an epoxy resin, a urea resin, and a silicone resin, and light-transmitting inorganic materials having a superior light resistance, such as silica sol and glass.

With respect to the fluorescent material to be used for the light emitting device of the present invention (the first fluorescent material used in the first sealing member layer and the second fluorescent material used in the second sealing member layer), preferable examples thereof include: Ce:YAG (cerium-activated yttrium-aluminum-garnet) fluorescent material, Eu:BOSE (europium-activated barium-strontium-orthosilicate) fluorescent material, Eu:SOSE (europium-activated strontium-barium-orthosilicate) fluorescent material, and europium-activated α-sialon fluorescent material; however, the present invention is limited thereto.

It should be noted that the first sealing member layer and the second sealing member layer of the present invention may contain a dispersing agent together with the fluorescent material. Although not particularly limited, preferable examples of the dispersing agent include barium titanate, titanium oxide, aluminum oxide, silicon oxide, calcium carbonate, and silicon dioxide.

As will be described later, the kinds and compositions of the sealing material and the fluorescent material to be used in the second sealing member layer are selected appropriately so as to adjust the chromaticity of the light emitting device in which only the first sealing member layer has been formed by forming the second sealing member layer so that chromaticity shifts are prevented. Preferable specific examples include a case in which methyl silicone is used as a resin material, and Eu:BOSE is dispersed therein as the first fluorescent material to be cured to form the first sealing member layer, and organic modified silicone is used as a resin material so as to cover this first sealing member layer, and Eu:SOSE is dispersed therein as the second fluorescent material to be cured so that the second sealing member layer is formed.

The present invention also provides a method for manufacturing a light emitting device. Although the method for manufacturing the above-described light emitting device of the present invention is not particularly limited, it is suitably manufactured by using the method for manufacturing a light emitting device of the present invention. The above-described light emitting device in accordance with the first aspect of the present invention can be suitably manufactured by using a method for manufacturing the light emitting device of the present invention that includes a process (light emitting element mounting process) in which a plurality of light emitting elements are mounted on a substrate, and the light emitting elements are electrically connected with external electrodes, a process (first sealing member layer forming process) for forming a first sealing member layer containing a first fluorescent material so as to cover the light emitting elements, a process (chromaticity measuring process) for measuring a chromaticity characteristic of the light emitting device after the first sealing member layer is formed thereon, and a process (second sealing member layer forming process) for forming a second sealing member layer on the first sealing member layer so that chromaticity shifts are adjusted in accordance with the measured chromaticity characteristic.

In the light emitting element mounting process, first, a plurality of light emitting elements are mounted on a substrate, and the light emitting elements are electrically connected to external electrodes. In the case of manufacturing a light emitting device (for example, light emitting devices 1, 11, 16, 31, 66, 78 as shown in FIGS. 1 to 7 as well as in FIGS. 15 and 17) in accordance with the second aspect, which is one of specific structural examples of a light emitting device of the first aspect of the present invention, a metal substrate as described above is used as the substrate in this light emitting element mounting process, and on this metal substrate, an insulating base member having through holes and a wiring pattern formed thereon is formed, and the light emitting elements are mounted within the through holes to be electrically connected to the wiring pattern that is preliminarily electrically connected to the external electrodes (more specifically, the above-described positive electrode externally connecting land and negative electrode externally connecting land).

Figure 23:
FIG. 23 is a diagram showing a method for manufacturing a light emitting device of the present invention step by step, in the case where light emitting device 1 of each of the examples shown in FIGS. 1 and 2 is manufactured.
Figure 23:
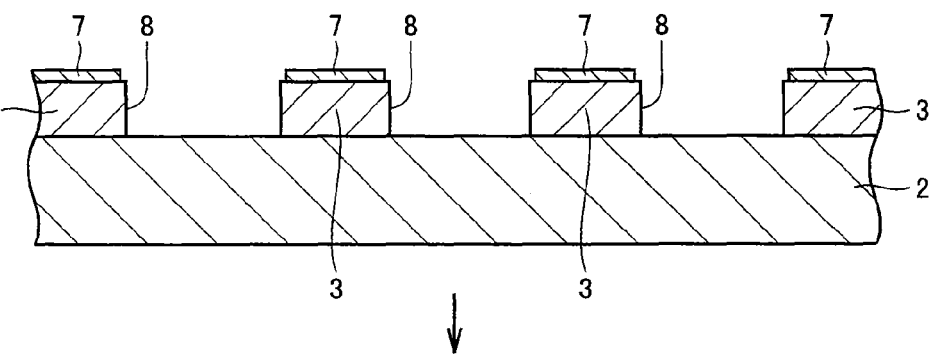
Figure 23:
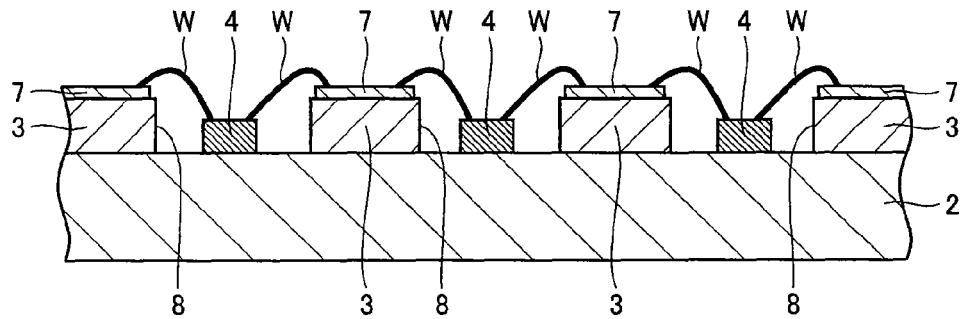
Figure 23:
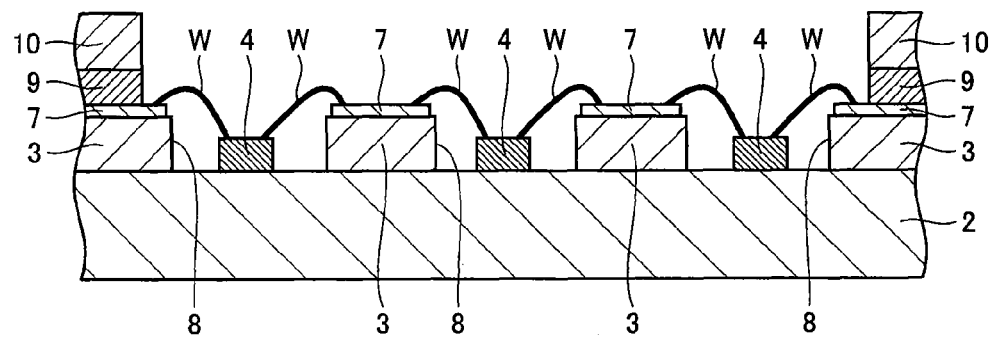
Figure 24:
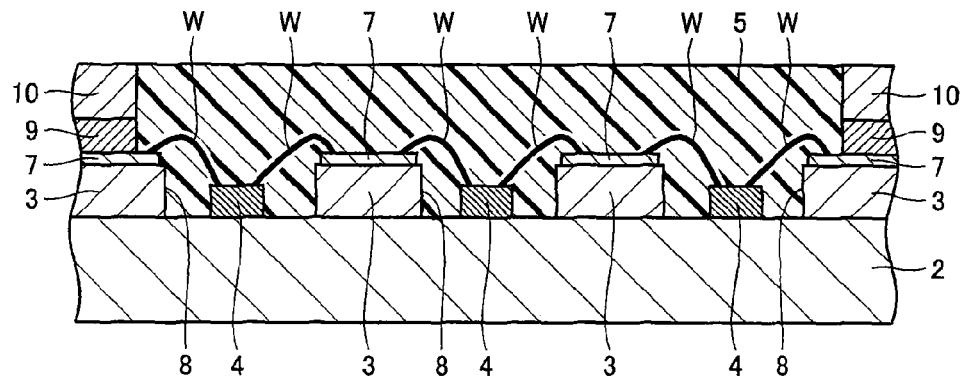
FIG. 24 is a diagram showing a method for manufacturing a light emitting device of the present invention step by step, in the case where light emitting device 1 of each of the examples shown in FIGS. 1 and 2 is manufactured.
Figure 24:
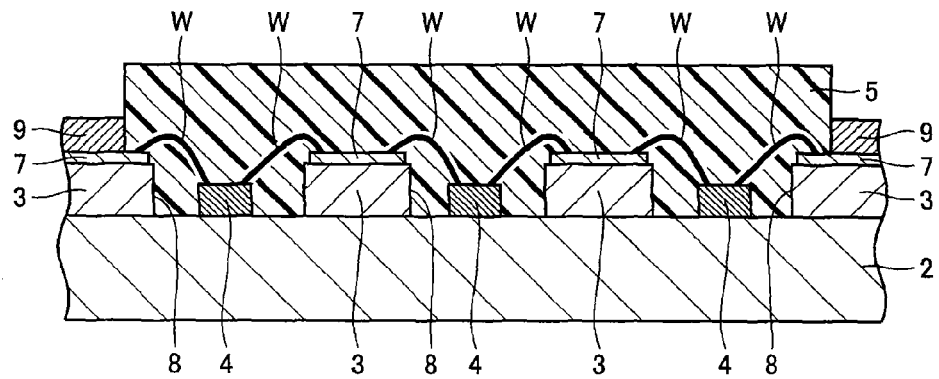
Figure 24:
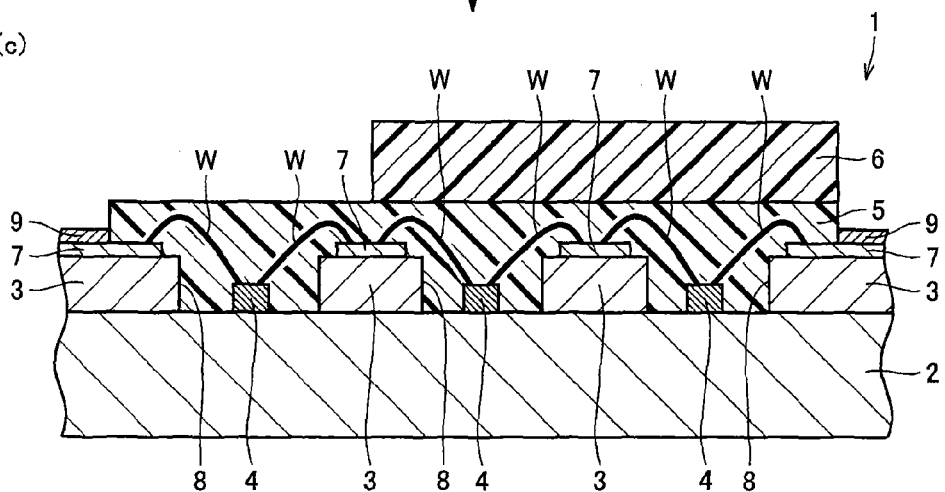

FIGS. 23 and 24 are diagrams showing a method for manufacturing the light emitting device of the present invention step by step, in the case of manufacturing light emitting device 1 in the example shown in FIGS. 1 and 2. First, a metal substrate 2 is prepared (FIG. 23(a)), and on this metal substrate 2, an insulating base member 3, which has through holes 8 and a wiring pattern 7 formed on the surface thereof, is formed (FIG. 23(b)). This insulating base member 3 may be formed by applying a material having an insulating property such as polyimide as mentioned above to metal substrate 2 to be dried thereon. Next, as shown in FIG. 23(c), light emitting elements 4 are mounted on metal substrate 2 exposed inside each through hole 8 of insulating base member 3, and light emitting elements 4 and wiring pattern 7 are electrically connected to each other by using bonding wires W. In the case where light emitting device 1 in the example shown in FIGS. 1 and 2 is manufactured, a solder resist 9 is then formed on insulating base member 3 so as to surround the region on which light emitting elements 4 are mounted, and a rubber sheet 10 is further placed thereon (FIG. 23(d)). With respect to rubber sheet 10, a silicone rubber sheet having through holes may be suitably used. The shape of the through holes of this rubber sheet 10 may be selected appropriately in accordance with the shape of the first sealing member layer to be formed (the aforementioned shapes having top shapes such as a rectangular shape, a hexagonal shape, a round shape, and a top shape with a plurality of straight line portions).

Moreover, in the case of manufacturing a light emitting device (for example, light emitting devices 41, 51, 56, 61, 68, 80 as shown in FIGS. 8 to 14 as well as in FIGS. 16 and 18) in accordance with the third aspect, which is one of specific structural examples of a light emitting device of the first aspect of the present invention, a metal substrate is used as the substrate in the light emitting element mounting process, an insulating base member is formed on this metal substrate, metal plates are placed on the insulating base member so as to form a spaced portion therebetween, and the light emitting elements are mounted on the metal plates (preferably, with metal plating being interposed therebetween) so that the light emitting elements are electrically connected to the metal plate while being also electrically connected to the metal plate that is adjacent thereto with the spaced portion interposed therebetween.

Figure 25:
FIG. 25 is a diagram showing a method for manufacturing a light emitting device of the present invention step by step, in the case where light emitting device 41 of each of the examples shown in FIGS. 8 and 9 is manufactured.
Figure 25:
Figure 25:
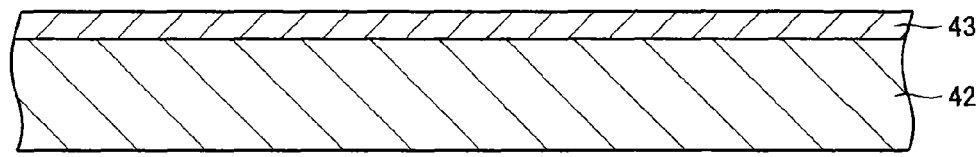
Figure 25:
Figure 25:
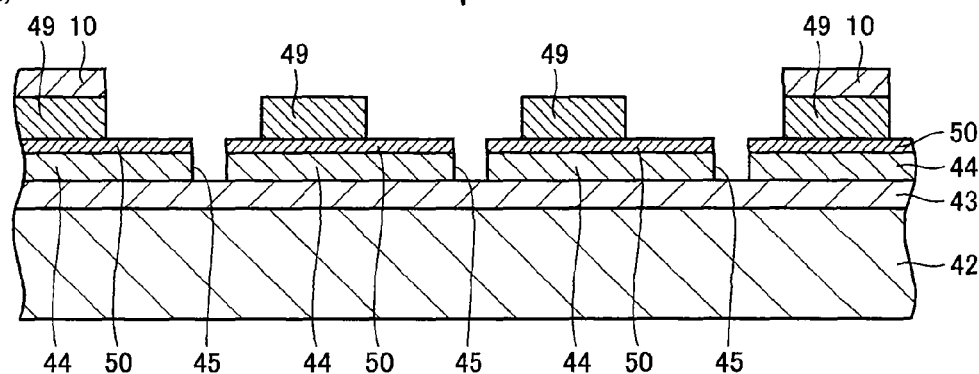
Figure 26:
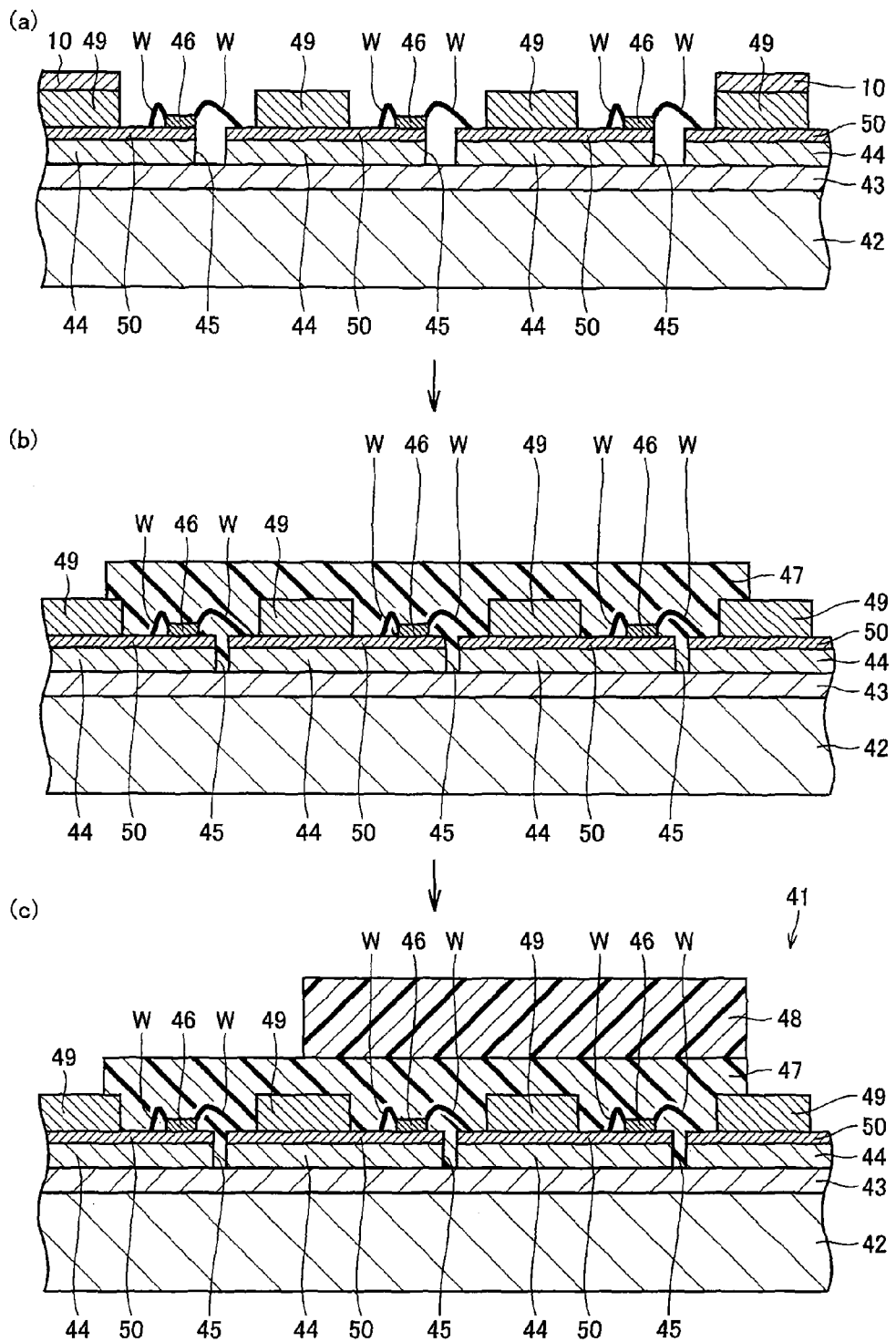
FIG. 26 is a diagram showing a method for manufacturing a light emitting device of the present invention step by step, in the case where light emitting device 41 of each of the examples shown in FIGS. 8 and 9 is manufactured.

FIGS. 25 and 26 are diagrams showing a method for manufacturing the light emitting device of the present invention step by step, in the case of manufacturing light emitting device 41 in the example shown in FIGS. 8 and 9. First, a metal substrate 42 is prepared (FIG. 25(a)), and an insulating base member 43 is formed on this metal substrate 42 (FIG. 25(b)). This insulating base member 43 may be formed by applying the aforementioned material having an insulating property such as polyimide to metal substrate 42 to be dried thereon, as described on the manufacturing of the light emitting device in accordance with the second aspect. Next, metal plates 44 are placed on insulating base member 43 so as to allow a spaced portion 45 to be formed therebetween, and metal plating 50 is further formed thereon. In forming metal plating 50, the metal plating is formed with a mask corresponding to a desired wiring pattern being placed on metal plate 44, so that metal plating 50 is formed in such a manner as to have the desired wiring pattern. Next, a solder resist 49 is formed on metal plating 50, and a rubber sheet 10 is placed on this solder resist 49 (FIG. 25(c)). In the same manner as in the method for manufacturing the light emitting device of the second aspect, a silicone rubber sheet with through holes having an appropriate shape may be suitably used. Next, as shown in FIG. 26(a), light emitting elements 46 are mounted within a region on metal plating 50 other than the region on which solder resist 49 has been provided. Moreover, light emitting element 46 and metal plate 44 on which that light emitting element 46 is mounted are electrically connected to each other (in an example of FIG. 26(a), with metal plating 50 interposed therebetween) by using a bonding wire W such as a gold wire, and the light emitting element 46 is also electrically connected to metal plate 44 that is adjacent to that metal plate 44 on which light emitting element 46 is mounted, with light emitting elements 46 and spaced portion 45 being interposed therebetween (in the example of FIG. 26(a), with metal plating 50 interposed therebetween).

In the subsequent first sealing member layer forming process, a first sealing member layer containing a first fluorescent material is formed so as to cover the light emitting elements. More specifically, in either case of manufacturing the light emitting device of the second aspect or the light emitting device of the third aspect, a sealing material containing a first fluorescent material is injected into a region on which light emitting elements 4 or 46 enclosed with solder resist 9 or 49 and rubber sheet 10 are mounted, to be cured thereon, so that first sealing member layer 5 or 47 is formed in such a manner as to cover light emitting elements 4 or 46 (FIG. 24(a) and FIG. 26(b)). In the case where blue-color based semiconductor light emitting elements made of a gallium nitride-based semiconductor are used as light emitting elements 4 or 46 as described earlier, with respect to the first fluorescent material to be contained in first sealing member layer 5 or 47, a fluorescent material that is excited by light from the semiconductor light emitting elements to emit yellowish light may be suitably used. In forming the first sealing member layer, the first fluorescent material is preliminarily dispersed in the above-mentioned sealing material made of a light-transmitting resin material or the like, such as an epoxy resin or a silicone resin, and after being dropped so as to fill the inside of each through hole of rubber sheet 10, the sealing material may be cured, or resin sealing members, preliminarily molded by using a metal mold, may be used. It should be noted that the method for curing the sealing material, not is particularly limited, and any of conventionally known methods may be appropriately used in accordance with the sealing material to be used. For example, when a silicone resin that is a light-transmitting resin material is used as the sealing material, the sealing material may be cured by thermally curing the silicone resin.

In the subsequent chromaticity measuring process, a chromaticity characteristic of the light emitting device on which the first sealing member layer has been formed in the above-described first sealing member layer forming process is measured. The chromaticity characteristic of the light emitting device can be measured by using a measuring device which uses an optical system of d·8 (diffused lighting 8°: light-receiving system) in accordance with DIN5033tei17, ISOk772411, under the condition C of JIS Z 8722. FIG. 27 is a graph showing chromaticity coordinates of CIE (Commission Internationale de l'Eclairage). For example, in the case where, in order to obtain light that corresponds to x, y=(0.325, 0.335) on the CIE chromaticity diagram, a material prepared by mixing the first fluorescent material and a silicone resin serving as the sealing material at a weight ratio of 5:100, is injected into each through hole of silicone rubber sheet 10, and thermally cured at 150° C. for one hour to form the first sealing member layer, the chromaticity range of the first sealing member layer thus formed is located within a region (a) in FIG. 27. In the case of measuring chromaticity characteristics on the light emitting device having the first sealing member layer of this kind, the chromaticity range goes out of a region (b) in FIG. 27. In such a case, a second sealing member layer is formed in order to adjust such chromaticity shifts in the subsequent second sealing member layer forming process.

In the second sealing member forming process, the second sealing member layer is formed on the first sealing member layer so as to adjust chromaticity shifts in accordance with the chromaticity characteristics of the light emitting device on which the first sealing member layer has been formed, measured in the above-described chromaticity measuring process. More specifically, in either case of manufacturing the light emitting device of the second aspect or the light emitting device of the third aspect, a sealing material containing a second fluorescent material is injected onto first sealing member layer 5 or 47 to be cured thereon in the same manner as in the aforementioned first sealing member layer forming process, so that second sealing member layer 6 or 48 is formed (FIG. 24(c), FIG. 26(c)).

The second fluorescent material and the sealing material to be used for forming second sealing member layers 6 and 48 are selected appropriately from the first fluorescent materials and sealing materials used for forming the aforementioned first sealing member layer, in accordance with desired chromaticity characteristics, and may be prepared by further adding a dispersing agent thereto as needed. In the above-described case, in order to obtain light that corresponds to x, y=(0.345, 0.35) on the CIE chromaticity diagram, for example, a material prepared by mixing the second fluorescent material and a silicone resin serving as the sealing material at a weight ratio of 5:100 is injected onto the first sealing member layer, and thermally cured at 150° C. for one hour to form the second sealing member layer. As such, when measuring the chromaticity characteristics of the light emitting device after the formation of the second sealing member layer, the resulting light emitting device can have a chromaticity range that is located within region (b) in FIG. 27.

By removing rubber sheet 10 after the formation of the second sealing member layer, the light emitting device of the present invention that has been described is manufactured. As described above, a double-sided bonding sheet is preliminarily bonded to one of the surfaces of silicone rubber sheet 10, and by allowing the silicone rubber sheet 10 to be bonded via this bonding sheet, the silicone rubber sheet can be easily removed. It should be noted that the silicone rubber sheet may be used repeatedly.

In the method for manufacturing a light emitting device of the present invention, chromaticity characteristics are preferably measured also on the light emitting device after the formation of the second sealing member layer as described above. The method for measuring the chromaticity characteristics may be carried out in the same manner as in the aforementioned method as described on the light emitting device after the formation of the first sealing member layer.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light emitting device comprising:
    a substrate;
    a light emitting unit including a plurality of light emitting elements mounted on the substrate and electrically connected to external electrodes;
    a first sealing member layer containing fluorescent material and formed to cover the light emitting elements; and
    a second sealing member layer containing fluorescent material and formed on the first sealing member layer,
    wherein the second sealing member layer partially covers the first sealing member layer but does not cover each of the plurality of light emitting elements so as to influence a chromaticity characteristic of the light emitting device.

2. A light emitting device comprising:
    a metal substrate;
    an insulating base member having a through hole covering the metal substrate;
    a plurality of light emitting elements mounted inside the through hole of the insulating base member on the metal substrate;
    a wiring pattern formed on the insulating base member;
    a first sealing member layer covering the light emitting elements and the through hole; and
    externally connecting lands formed on the insulating base member,
    wherein the light emitting elements are electrically connected to the externally connecting lands through the wiring pattern.

3. The light emitting device according to claim 2, wherein the plurality of light emitting elements are mounted to be aligned in one row in the through hole and the wiring pattern is formed on the surface of the insulating base member in parallel with this linear alignment.

4. The light emitting device according to claim 3, wherein the light emitting elements are arranged to form a plurality of rows in parallel with one another.

5. The light emitting device according to claim 4, wherein a plurality of first sealing member layers are formed to cover each row of the light emitting elements that are arranged to form the plurality of rows in parallel with one another.

6. The light emitting device according to claim 2, wherein the light emitting elements arranged to form the plurality of rows in parallel with one another are electrically connected to the wiring pattern through a bonding wire commonly connected between the adjacent rows.

7. The light emitting device according to claim 6, wherein a plurality of first sealing member layers are formed to cover each row of the light emitting elements that are arranged so as to form the plurality of rows in parallel with one another.

8. A light emitting device comprising:
a metal substrate;
an insulating base member formed on the metal substrate;
metal plates placed on the insulating base member so as to form a spaced portion therebetween;
light emitting elements mounted on the metal plates;
a first sealing member layer covering the light emitting elements; and
externally connecting lands formed on the insulating base member,
wherein the light emitting elements are electrically connected to the metal plates, and
wherein the light emitting elements are electrically connected to the externally connecting lands through the metal plates.

9. The light emitting device according to claim 8, wherein the plurality of light emitting elements are mounted to be aligned in one row, and the metal plates are placed in such a manner as to form a spaced portion in parallel with the row of the light emitting elements.

10. The light emitting device according to claim 9, wherein the light emitting elements are arranged to form a plurality of rows in parallel with one another.

11. The light emitting device according to claim 10, wherein a plurality of first sealing member layers are formed to cover each row of the light emitting elements that are arranged to form the plurality of rows in parallel with one another.

12. The light emitting device according to claim 2, wherein the plurality of light emitting elements are mounted to be aligned in one row.

13. The light emitting device according to claim 12, wherein the light emitting elements are arranged to form a plurality of rows in parallel with one another.

14. The light emitting device according to claim 13, wherein a plurality of first sealing member layers are formed to cover each row of the light emitting elements that are arranged to form the plurality of rows in parallel with one another.

15. The light emitting device according to claim 2, wherein a plurality of first sealing member layers are formed to cover the light emitting elements one by one.

16. The light emitting device according to claim 2, wherein the first sealing member layer is formed in such a manner that the plurality of light emitting elements are covered with the single first sealing member layer.

17. The light emitting device according to claim 2, wherein the first sealing member layer is formed in such a manner that all the light emitting elements are covered with the single first sealing member layer.

18. The light emitting device according to claim 1, wherein the second sealing member layer is formed on at least any one of a plurality of first sealing member layers.

19. The light emitting device according to claim 2, wherein the first sealing member layer is formed to have any one of a rectangular top shape, a hexagonal top shape, a round top shape, and a top shape with a plurality of straight line portions.

20. The light emitting device according to claim 2, used as a backlight light source of a liquid crystal display or as a light source for illumination.

21. A method for manufacturing a light emitting device, comprising:
installing a plurality of light emitting elements on a substrate;
electrically connecting the light emitting elements to external electrodes;
forming a first sealing member layer containing fluorescent material in such a manner as to cover the light emitting elements;
measuring a first chromaticity characteristic of the light emitting device after the formation of the first sealing member layer; and
forming a second sealing member layer containing fluorescent material partially covering the first sealing member layer but not covering each of the plurality of light emitting elements so that the light emitting device has a second chromaticity characteristic.

\* \* \* \* \*